US007361451B2

(12) United States Patent
Oshima et al.

(10) Patent No.: US 7,361,451 B2

(45) Date of Patent: Apr. 22, 2008

(54) LITHOGRAPHIC PRINTING PLATE PRECURSOR AND LITHOGRAPHIC PRINTING METHOD USING THE SAME

(75) Inventors: Yasuhito Oshima, Shizuoka (JP); Tomoyoshi Mitsumoto, Shizuoka (JP)

(73) Assignee: Fujifilm Corporation, Tokyo (JP)

(*) Notice: Subject to any disclaimer, the term of this patent is extended or adjusted under 35 U.S.C. 154(b) by 259 days.

(21) Appl. No.: 10/883,714

(22) Filed: Jul. 6, 2004

(65) Prior Publication Data

US 2005/0008970 A1 Jan. 13, 2005

(30) Foreign Application Priority Data

Jul. 7, 2003 (JP) ............................ 2003-271372

(51) Int. Cl.
*G03F 7/32* (2006.01)

(52) U.S. Cl. ................ 430/302; 430/270.1; 430/281.1; 101/465; 101/466; 101/467

(58) Field of Classification Search ................ 430/302, 430/270.1, 281.1; 101/465, 466, 467
See application file for complete search history.

(56) References Cited

U.S. PATENT DOCUMENTS

| | | | | |
|---|---|---|---|---|
| 6,623,910 | B2 * | 9/2003 | Shimada et al. | 430/270.1 |
| 6,632,580 | B2 | 10/2003 | Maemoto | |
| 6,936,384 | B2 * | 8/2005 | Munnelly et al. | 430/17 |
| 7,041,429 | B2 * | 5/2006 | Ohta et al. | 430/270.1 |
| 2002/0068240 | A1 | 6/2002 | Teng | |
| 2002/0106583 | A1 * | 8/2002 | Kawamura et al. | 430/271.1 |
| 2003/0188653 | A1 | 10/2003 | Yanaka | |
| 2004/0202962 | A1 * | 10/2004 | Yu et al. | 430/302 |

FOREIGN PATENT DOCUMENTS

| | | | |
|---|---|---|---|
| EP | 1203660 | A1 | 5/2002 |
| EP | 1241002 | A2 | 9/2002 |
| EP | 1312473 | A2 | 5/2003 |
| EP | 1470914 | A2 | 10/2004 |
| EP | 1491356 | A2 | 12/2004 |
| EP | 1470914 | A3 | 7/2005 |

* cited by examiner

*Primary Examiner*—John S. Chu
(74) *Attorney, Agent, or Firm*—Birch, Stewart, Kolasch & Birch, LLP

(57) ABSTRACT

A lithographic printing plate precursor which is capable of being on-machine developed by supplying at least one of an ink and a fountain solution and comprises a hydrophilic support having provided thereon an image-forming layer containing the following components (1) to (3), wherein the image-forming layer further contains a filler: (1) an infrared absorbing agent; (2) a compound capable of generating an acid or a radical; and (3) a compound capable of undergoing addition polymerization with the acid or radical.

18 Claims, No Drawings

LITHOGRAPHIC PRINTING PLATE PRECURSOR AND LITHOGRAPHIC PRINTING METHOD USING THE SAME

This Non-provisional application claims priority under 35 U.S.C. § 119(a) on Patent Application No(s). 2003-271372 filed in Japan on Jul. 7, 2003, the entire contents of which are hereby incorporated by reference.

FIELD OF THE INVENTION

The present invention relates to a lithographic printing plate precursor and a lithographic printing method using the same and, more particularly, to a lithographic printing plate precursor having excellent on-machine developability, high sensitivity and high durability and to a lithographic printing method using the same.

BACKGROUND OF THE INVENTION

A lithographic printing plate ordinarily comprises an oleophilic image area receiving an ink in the printing step and a hydrophilic non-image area receiving a fountain solution. With conventional lithographic printing plates, it is common to mask-expose a PS plate comprising a hydrophilic support having provided thereon an oleophilic photosensitive resin layer through a lith film and to dissolve away the non-image area with a developing solution, thus making a printing plate.

In recent years, a computer electronically processes an image as a digital information, accumulates the digital data, and outputs them. Therefore, it is preferred that, in the image-forming process based on digital image information, image formation be conducted directly on a lithographic printing plate precursor without a lith film by scanning exposure using actinic radiation having a high directivity such as laser light. The technique of making a printing plate from digital information without a lith film is called computer-to-plate (CTP) technique.

In applying the computer-to-plate technique to a process for making a printing plate using a conventional PS plate, there arises a problem that a wavelength region of laser light does not match with a photosensitive wavelength of photosensitive resin.

Also, with the conventional PS plate, a step of dissolving away non-image areas (development processing) after exposure is indispensable. Further, after-processing steps such as a step of washing the development-processed printing plate with water, a step of processing it with a rinsing solution containing a surfactant, and a step of desensitization with a desensitizing solution containing gum Arabic or a starch derivative have also been necessary. It has been a point to be studied with respect to the conventional PS plates that the additional wet processings are necessary. Even when the former half of plate-making steps (image-forming processing) is simplified by the aforesaid digital processing, advantages due to the simplification are marginal if the latter half (development processing) is a complicated wet processing.

In particular, the whole industry has taken a great interest in the environment of the earth in recent years. From the viewpoint of consideration on the environment of the earth, too, the wet after-processing should preferably be simplified or changed to dry processing.

As one of the methods of omitting processing steps, there is a method called on-machine development wherein an exposed printing plate precursor is mounted on a cylinder of the printing machine and, while rotating the cylinder, a fountain solution and an ink are supplied thereto to thereby remove a non-image area of the printing plate precursor. That is, the method is a system wherein an exposed printing plate precursor is mounted as it is on a printing machine, and its processing is completed during an ordinary printing step.

The lithographic printing plate precursor suited for such an on-machine development has a photosensitive layer soluble in a fountain solution or an ink solvent and also has a light-room handleability suitable for being developed on a printing machine placed in a light room.

Conventional PS plates substantially fail to meet such requirements.

There has been proposed a lithographic printing plate precursor comprising a hydrophilic support having provided thereon a photosensitive layer wherein fine particles of a thermoplastic hydrophobic polymer is dispersed in a hydrophilic binder polymer (see, for example, Patent Literature 1). In making a printing plate, the lithographic printing plate precursor is exposed with an infrared laser to form an image by coalescing (fusing) the fine particles of the thermoplastic hydrophobic polymer by heat generated due to light-heat conversion, then the lithographic printing plate precursor having formed the image is mounted on a cylinder of a printing machine, and at least one of a fountain solution and an ink is fed to the precursor to conduct on-machine development. The lithographic printing plate precursor has a photosensitive region in an infrared region, and hence has a light-room handleability.

However, the image formed by coalescing (fusing) fine particles of a thermoplastic hydrophobic polymer has an insufficient strength, thus involving a problem with respect to printing durability of a printing plate.

A lithographic printing plate precursor containing microcapsules containing a polymerizable compound in place of the thermoplastic fine particles has been proposed (see, for example, Patent Literatures 2 to 7). The polymer image formed by the reaction of the polymerizable compound has better strength than that of the image formed by fusing fine particles.

Since the polymerizable compound has a high reactivity, there have been proposed many techniques for isolation thereof using microcapsule (see, for example, Patent Literatures 2 to 7). A thermally decomposable polymer is used as a shell of the microcapsule.

However, lithographic printing precursors described in Patent Literatures 2 to 7 above do not have sufficient developability on a printing machine.

Patent Literature 1: Japanese Patent No. 2938397

Patent Literature 2: JP-A-2000-211262 (the term "JP-A" as used herein means an "unexamined published Japanese patent application")

Patent Literature 3: JP-A-2001-277740

Patent Literature 4: JP-A-2002-29162

Patent Literature 5: JP-A-2002-46361

Patent Literature 6: JP-A-2002-137562

Patent Literature 7: JP-A-2002-326470

SUMMARY OF THE INVENTION

An object of the invention is to provide a lithographic printing plate precursor having excellent developability on a printing machine, a high sensitivity and a high durability, and a lithographic printing method using the same.

Other objects of the invention will become apparent from the following description.

The invention provides the following lithographic printing plate precursor and lithographic printing process:

(1) A lithographic printing plate precursor which is capable of being on-machine developed by supplying at least one of an ink and a fountain solution and comprises a hydrophilic support having provided thereon an image-forming layer containing the following components (1) to (3), wherein the image-forming layer further contains a filler:

(1) an infrared absorbing agent;

(2) a compound capable of generating a radical; and (3) a compound capable of undergoing addition polymerization with the radical.

(2) A lithographic printing plate precursor which is capable of being on-machine developed by supplying at least one of an ink and a fountain solution and comprises a hydrophilic support having provided thereon an image-forming layer containing the following components (1) to (3), wherein the image-forming layer further contains a filler:

(1) an infrared absorbing agent;

(2) a compound capable of generating an acid; and (3) a compound capable of undergoing addition polymerization with the acid.

(3) The lithographic printing plate precursor as described in item (1) or (2), wherein the filler is selected from metal oxides, metal silicates and internally cross-linked organic fine particles.

(4) The lithographic printing plate precursor as described in any one of items (1) to (3), wherein the filler is surface-treated with a compound having an ethylenically unsaturated bond.

(5) The lithographic printing plate precursor as described in any one of items (1) to (4), wherein an amount of the filler in the image-forming layer is from 0.1 to 30% by weight.

(6) The lithographic printing plate precursor as described in any one of items (1) to (5), wherein an average particle size of the filler is from 0.03 to 200 μm.

(7) A lithographic printing method which comprising steps of;

imagewise exposing the lithographic printing plate precursor as describe in any one of items (1) or (6) with infrared laser;

making a lithographic printing plate by removing unexposed areas of the image-forming layer of the lithographic printing plate precursor mounted on a cylinder of a printing machine; and conducting printing using the lithographic printing plate mounted on the cylinder of the printing machine.

DETAILED DESCRIPTION OF THE INVENTION

The lithographic printing plate precursor of the invention is characterized by containing a filler in its image-forming layer, whereby the on-machine developability is markedly improved.

By incorporating the filler in the image-forming layer of the lithographic printing plate precursor of the invention which contains (1) an infrared absorbing agent, (2) a compound capable of generating an acid or a radical, and (3) a compound capable of undergoing addition polymerization with the acid or radical, developability of the precursor on a printing machine is improved, and high sensitivity and high printing durability are achieved. After imagewise exposure of the precursor with a laser light having a wavelength of from 700 to 1200 nm, non-image areas are removed by feeding at least one of an ink or a fountain solution to the precursor mounted on a printing machine, thereby conducting plate making and printing.

The lithographic printing plate precursor of the invention and the lithographic printing method using same are described in detail below.

The image-forming layer of the lithographic printing plate precursor of the invention contains (1) an infrared absorbing agent, (2) a compound capable of generating an acid or a radical, (3) a compound capable of undergoing addition polymerization with the acid or radical, and (4) a filler.

Of these, the filler (4), which is the most important element in the lithographic printing plate precursor of the invention, is first described.

As the filler, fillers ordinarily used for resins may be used. For example, metal oxides, metal hydroxides, metal carbonates, metal sulfates, metal silicates, metal nitrides, carbons and other fillers may be used.

Examples of the metal oxide include silica, diatomaceous earth, alumina, zinc oxide, titanium oxide, calcium oxide, magnesium oxide, iron oxide, tin oxide and antimony oxide.

Examples of the metal hydroxide include calcium hydroxide, magnesium hydroxide, aluminum hydroxide and basic magnesium carbonate.

Examples of the metal carbonate include calcium carbonate, magnesium carbonate, zinc carbonate, barium carbonate, dawsonite and hydrotalcite.

Examples of the metal sulfate include calcium sulfate, barium sulfate and gypsum fiber.

Examples of the metal silicate include calcium silicate, talc, kaolin, clay, mica, montmorillonite, bentonite, activated clay, sepiolite, imogolite, sericite, glass fiber, glass beads and silica-based balloon.

Examples of the metal nitride include aluminum nitride, boron nitride and silicon nitride.

Examples of the carbon include carbon black, graphite, carbon fiber, carbon balloon, charcoal powder, carbon nanotube and fullerene.

Examples of the other fillers include various metal powders (e.g., gold, silver, copper, tin), potassium titanate, lead titanate zirconate, aluminum borate, molybdenum sulfide, silicon carbide, stainless steel fiber, zinc borate, slag fiber, Teflon™ powder, wood powder, pulp, rubber powder and aramide fiber.

Also, internally cross-linked organic fine particles can be preferably used. The internally cross-linked organic fine particles can be obtained by emulsion polymerization of a multi-functional monomer having at least two polymerizable unsaturated double bonds within the molecule and a mono-functional monomer having a polymerizable unsaturated double bond. Specific examples thereof include those described as "cross-linked latex particles" in JP-A-2003-39841.

These fillers may be used alone or in combination of two or more thereof.

Of these, metal oxides, metal silicates and internally cross-linked organic fine particles are preferred, metal oxides and metal silicates are more preferred, silica, alumina, titanium oxide, talc, kaolin, clay, activated clay, sepiolite gna glass beads are particularly preferred, and silica and alumina are most preferred.

Examples of the filler shape include fibrous, needle-like, platy, spherical, granular (amorphous, hereinafter the same), tetrapod-like and balloon-like shapes. Of these, fibrous, granular, needle-like, platy and spherical shapes are preferred, and spherical, granular and platy shapes are particularly preferred. Further, porous fillers are preferred since they provide good on-machine developability.

The fillers may be surface-treated with a treating agent. As the treating agent, ordinary treating agents may be used. For example, a silane coupling agent, a titanate coupling agent, an aluminate coupling agent, a fatty acid, fat and oil, a polyethylene glycol-type nonionic surfactant, a polyhydric alcohol-type nonionic surfactant, wax, a carboxylic acid coupling agent, and a phosphoric acid coupling agent may be used.

Examples of the silane coupling agent include γ-chloropropyltrimethoxysilane, vinyltriethoxysilane, vinyltrimethoxysilane, vinyltris(β-methoxyethoxy)silane, γ-methacryloxypropyltrimethoxysilane and β-(3,4-epoxycyclohexyl)ethyltrimethoxysilane.

Examples of the titanate coupling agent include isopropyltriisostearoyl titan. Examples of the aluminate coupling agent include acetoalkoxyaluminum diisopropylate.

Examples of the fatty acid include stearic acid, oleic acid, linoleic acid, linolenic acid and eleostearic acid.

Examples of the fat and oil include coconut oil, rice bran oil, soybean oil, linseed oil, dehydrated castor oil, safflower oil and tung oil.

Examples of the polyethylene glycol-type nonionic surfactant include an ethylene oxide adduct of higher alcohol, an ethylene oxide adduct of fatty acid, an ethylene oxide adduct of higher alkylamine and an ethylene oxide adduct of polypropylene glycol.

Examples of the polyhydric alcohol-type nonionic surfactant include a fatty acid ester of polyethylene oxide or glycerin, a fatty acid ester of pentaerythritol, a fatty acid ester of sorbitol or sorbitan, an alkyl ether of polyhydric alcohol and an aliphatic amide of alkanolamine.

Examples of the wax include maleinized polypropylene and maleinized polyethylene.

Examples of the carboxylic acid coupling agent include carboxylated polybutadiene and carboxylated polyisoprene.

Examples of the phosphoric acid coupling agent include monooctyl phosphate, mono(2,6-dimethyl-7-octenyl)phosphate, mono(6-mercaptohexyl)phosphate and mono(2-methacryloxypropyl)phosphate.

Of these, compounds having an ethylenically unsaturated bond is preferred for the surface treatment, and the silane coupling agent having an ethylenically unsaturated bond is particularly preferred for the surface treatment. Also, the surface of fillers are preferably subjected to a hydrophilicity-imparting treatment since it serves to improve stainproof properties. Thus, surface treatment with a silane coupling agent, a titanate coupling agent, an aluminate coupling gagent, a polyethylene glycol-type nonionic surfactant, a polyhyudric alcohol-type nonionic surfactant or a phosphoric acid couploing agent is preferred, and surface treatment with a silane coupling agent, a polyethylene glycol-type nonionic surfactant or a polyhydric alcohol-type nonionic surfactant is particularly preferred.

In the invention, the addition amount of the filler may be variously changed depending upon kinds and addition amounts of other components in the image-forming layer, and is preferably from 0.1 to 30% by weight, more preferably from 0.5 to 20% by weight, particularly preferably from 1 to 10% by weight. The size of the filler in terms of average particle size is preferably 1/20 to 100 times, more preferably 1/10 to 80 times, still more preferably 1/5 to 50 times, most preferably 1 to 20 times, of the average thickness of the image-forming layer. Specifically, an average particle size of the filler is preferably from 0.03 to 200 μm, more preferably from 0.06 to 160 μm, still more preferably from 0.12 to 100 μm, most preferably from 0.6 to 40 μm. The fillers having an average particle size within such a range can effectively provide the effect of improving on-machine developability.

Next, (1) an infrared absorbing agent, (2) a compound capable of generating an acid or a radical and (3) a compound capable of undergoing addition polymerization with the acid or radical, which are contained in the image-forming layer of the lithographic printing plate precursor of the invention are described in detail below.

(1) Infrared Absorbing Agent

As the infrared absorbing agent used in the image-forming layer of the lithographic printing plate precursor of the invention, any substance that absorbs light energy radiation used for recording can be used without particular limitation as to absorption wavelength region. However, from the viewpoint of aptitude for an easily available high output laser, infrared ray-absorbing dyes or pigments having an absorption maximum in a wavelength range of from 700 nm to 1200 nm are preferred.

[Infrared Ray-absorbing Dyes or Pigments]

As the dye, commercially available dyes and known dyes described in literatures, for example, *Senryo Binran* (Dye Handbook) compiled by Yuki Gosei Kagaku Kyokai (1970) may be used. Specifically, the dyes include azo dyes, metal complex azo dyes, pyrazolone azo dyes, naphthoquinone dyes, anthraquinone dyes, phthalocyanine dyes, naphthalocyanine dyes, carbonium dyes, quinoneimine dyes, methane dyes, cyanine dyes, squarylium dyes, (thio)pyrylium dyes, metal-thiolate complexes, indoaniline metal complex-type dyes, oxonol dyes, diimonium dyes, aminium dyes, croconium dyes, and intermolecular CT dyes.

Examples of preferred dyes include cyanine dyes described in JP-A-58-125246, JP-A-59-84356, JP-A-59-202829 and JP-A-60-78787; methane dyes described in JP-A-58-173696, JP-A-58-181690 and JP-A-58-194595; naphthoquinone dyes described in JP-A-58-112793, JP-A-58-224793, JP-A-59-48187, JP-A-59-73996, JP-A-60-52940 and JP-A-60-63744; squarylium dyes described in JP-A-58-112792; and cyanine dyes described in British Patent 434,875.

Also, near infrared ray-absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 (the term "JP-B" as used herein means an "examined Japanese patent publication") and JP-B-5-19702 are also preferably used.

Other preferred examples of the dye include near infrared absorbing dyes represented by formulae (I) and (II) in U.S. Pat. No. 4,756,993.

Of these dyes, cyanine dyes, phthalocyanine dyes, oxonol dyes, squarylium dyes, pyrylium dyes, thiopyrylium dyes and nickel thiolate complexes are particularly preferred.

Cyanine dyes represented by the following general formula (a) are particularly preferred due to their excellent infrared absorbing efficiency.

Formula (a)

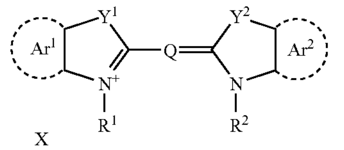

In formula (a), $R^1$ and $R^2$ each independently represents an alkyl group having 1 to 12 carbon atoms, which may have a substituent selected from an alkoxy group, an aryl group, an amido group, an alkoxycarbonyl group, a hydroxyl group, a sulfo group and a carboxyl group; $Y^1$ and $Y^2$ each independently represents oxygen, sulfur, selenium, a dialkylmethylene group or —CH═CH—; $Ar^1$ and $Ar^2$ each independently represents an aromatic hydrocarbon group which may have a substituent selected from an alkyl group, an alkoxy group, a halogen atom and an alkoxycarbonyl group, or $Ar^1$ and $Ar^2$ may form a condensed ring together with two sequent carbon atoms adjacent to $Y^1$ and $Y^2$, respectively.

In formula (a), X represents a counter ion necessary for neutralizing charge and, in the case when a cation moiety of the dye has an anionic substituent, X is not always necessary. Q represents a polymethine group selected from a trimethine group, a pentamethine group, a heptamethine group, a nonamethine group and an undecamethine group. From the viewpoint of wavelength aptitude for infrared rays used for exposure and stability, Q preferably represents a pentamethine group, a heptamethine group or a nonamethine group. From the viewpoint of stability, Q preferably has a cyclohexene ring or cyclopentene ring containing three sequent methane units on carbon atoms at any positions.

In formula (a), Q may be substituted by a substituent selected from an alkoxy group, an aryloxy group, an alkylthio group, an arylthio group, a dialkylamino group, a diarylamino group, a halogen atom, an alkyl group, an aralkyl group, a cycloalkyl group, an aryl group, an oxy group, an iminium base and a substituent represented by the following formula (i). Examples of the preferred substituent include a halogen atom such as a chlorine atom, a diarylamino group such as a diphenylamino group and an arylthio group such as a phenylthio group.

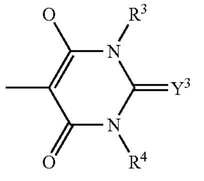

(i)

In formula (i), $R^3$ and $R^4$ each independently represents a hydrogen atom, an alkyl group having 1 to 8 carbon atoms or an aryl group having 6 to 10 carbon atoms, and $Y^3$ represents an oxygen atom or a sulfur atom.

Of the cyanine dyes represented by the formula (a), heptamethine cyanine dyes represented by any one of the following formulae (a-1) to (a-4) are preferred in the case of exposing with infrared rays of 800 to 840 nm in wavelength.

Formula (a-1)

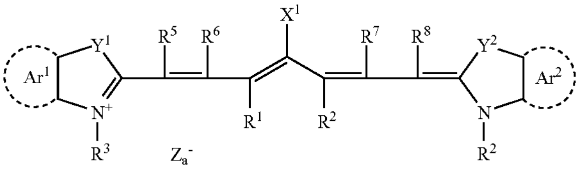

In formula (a-1), $X^1$ represents a hydrogen atom or a halogen atom, and $R^1$ and $R^2$ each independently represents a hydrocarbon group having 1 to 12 carbon atoms. From the viewpoint of storage stability of a coating solution for an image-forming layer, $R^1$ and $R^2$ each preferably represents a hydrocarbon group having 2 or more carbon atoms and, more preferably, $R^1$ and $R^2$ are bound to each other to form a 5-membered or 6-membered ring.

In formula (a-1), $Ar^1$ and $Ar^2$, which may be the same or different, each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. From the viewpoint of availability of raw materials, $R^5$, $R^6$, $R^7$ and $R^8$ are preferably hydrogen atoms. $Za^-$ represents a counter anion necessary for neutralizing the charge and, where the dye has an anionic substituent within its structure and therefore does not require neutralization of the charge, $Za^-$ is not necessary. From the standpoint of storage stability of the coating solution for image-forming layer, $Z^-$ is preferably a halogen ion, a perchlorate ion, a tetrafluoroborate ion, a hexafluorophosphate ion or a sulfonate ion, and particularly preferably a perchlorate ion, a tetrafluoroborate ion, a hexafluorophosphate ion or a sulfonate ion.

Formula (a-2)

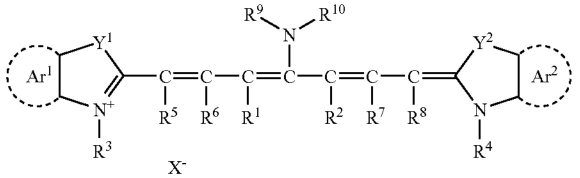

In formula (a-2), $R^1$ and $R^2$ each independently represents a hydrogen atom or a hydrocarbon group having 1 to 12 carbon atoms, or $R^1$ and $R^2$ may be bound to each other to form a ring structure. The ring formed is preferably a 5-membered ring or a 6-membered ring, and is particularly preferably a 5-membered ring. $Ar^1$ and $Ar^2$, which may be the same or different, each represents an aromatic hydrocarbon group which may have a substituent. Preferred examples of the aromatic hydrocarbon group include a benzene ring and a naphthalene ring. Preferred examples of the substituent on the aromatic hydrocarbon group include a hydrocarbon group having 12 or less carbon atoms, a halogen atom, an alkoxy group having 12 or less carbon atoms, an alkoxycarbonyl group, an alkylsulfonyl group and a halogenated alkyl group. An electron attractive substituent is particularly preferred. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. From the viewpoint of availability, $R^5$, $R^6$, $R^7$ and $R^8$ are hydrogen atoms. $R^9$ and $R^{10}$, which may be the same or different, each represents an aromatic hydrocarbon having 6 to 10 carbon atoms, which may have a substituent, an alkyl group having 1 to 8 carbon atoms, a hydrogen atom, or $R^9$ and $R^{10}$ may be bound to each other to form a ring structure shown below:

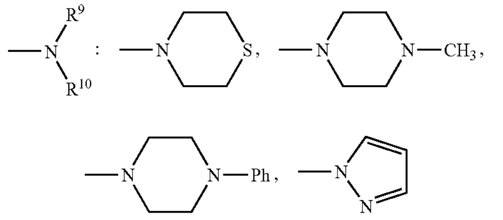

As $R^9$ and $R^{10}$ in formula (a-2), an aromatic hydrocarbon group such as a phenyl group is most preferred among the above-described groups.

$X^-$ is a counter anion necessary for neutralizing the charge and has the same meaning as defined for $Za^-$ in the foregoing formula (a-1).

Formula (a-3)

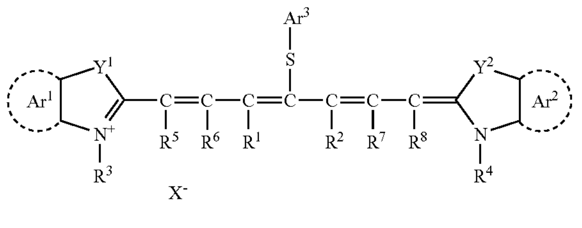

In formula (a-3), $R^1$ to $R^8$, $Ar^1$, $Ar^2$, $Y^1$, $Y^2$ and $X^-$ have the same meanings as those defined with respect to the foregoing formula (a-2), respectively. $Ar^3$ represents an aromatic hydrocarbon group such as a phenyl group or a naphthyl group, or a monocyclic or polycyclic heterocyclic group, and is preferably a heterocyclic group selected from a thiazole-base, a benzothiazole-base, a naphthothiazole-base, a thianaphtheno-7,6,4,5-thiazole-base, an oxazole-base, a benzoxazole-base, a naphthoxazole-base, a selenazole-base, a benzoselenazole-base, a naphthoselenazole-base, a thiazoline-base, a 2-quinoline-base, a 4-quinoline-base, a 1-isoquinoline-base, a 3-isoquinoline-base, a benzimidazole-base, a 3,3-dialkylbenzindolenine-base, a 2-pyridine-base, a 4-pyridine-base, a 3,3-dialkylbenz[e]indole-base, a tetrazole-base, a triazole-base, a pyrimidine-base, and a thiadiazole-base. As the particularly preferable heterocyclic groups, there are those having the following structures:

$Ar^3$:

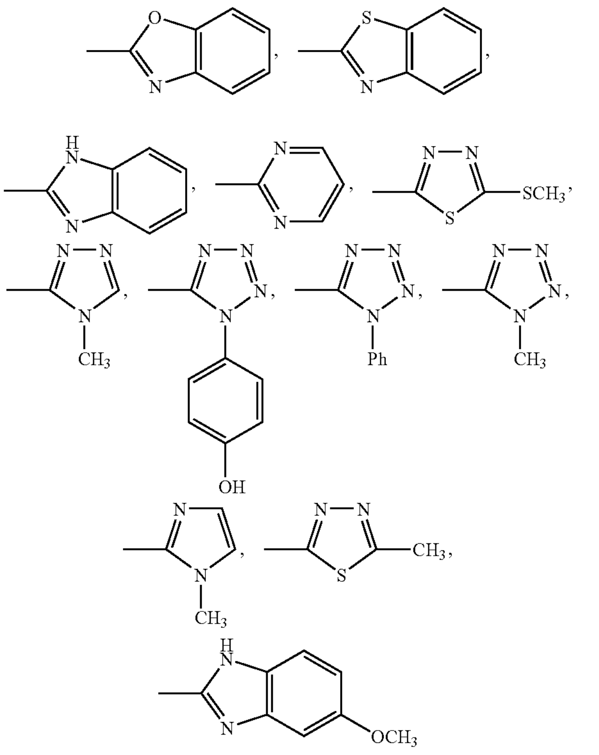

Formula (a-4)

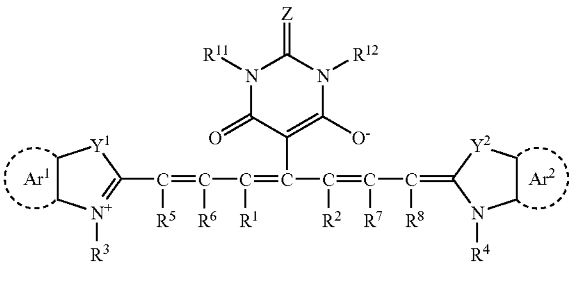

In formula (a-4), $R^1$ to $R^8$, $Ar^1$, $Ar^2$, $Y^1$ and $Y^2$ have the same meanings as those defined with respect to the foregoing formula (a-2), respectively. $R^{11}$ and $R^{12}$, which may be the same or different, each represents a hydrogen atom, an aryl group, a cyclohexyl group or an alkyl group having 1 to 8 carbon atoms. Z represents an oxygen atom or a sulfur atom.

Specific examples of the cyanine dyes represented by formula (a), which are preferably used in the invention, include those illustrated below and, in addition, those described in JP-A-2001-133969, paragraphs [0017] to [0019], JP-A-2002-40638, paragraphs [0012] to [0038], and JP-A-2002-23360, paragraphs [0012] to [0023].

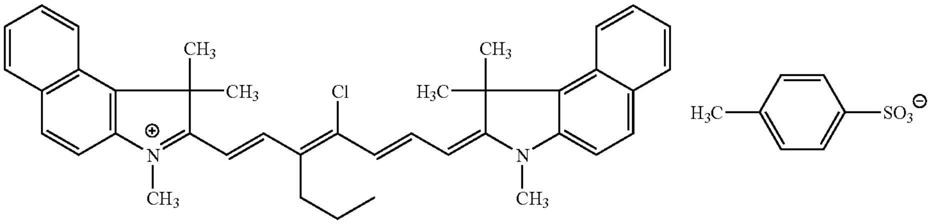
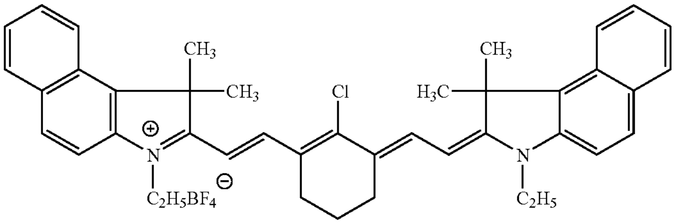
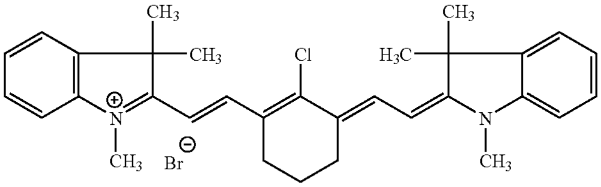
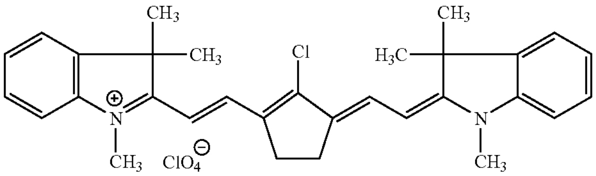
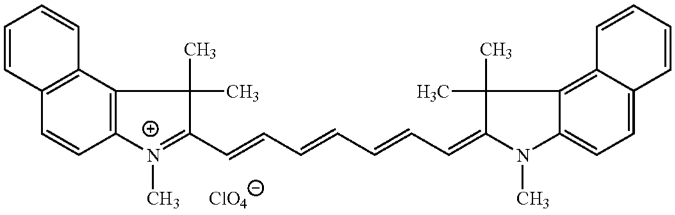
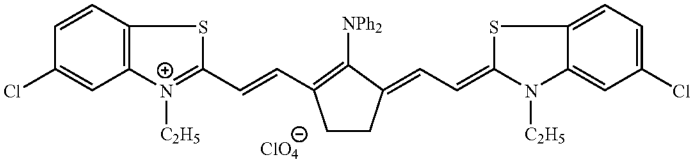
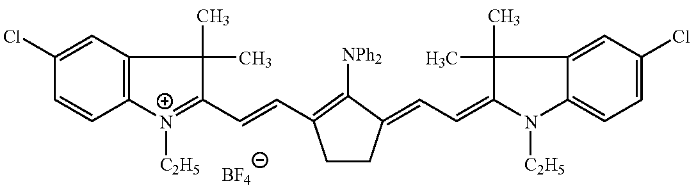
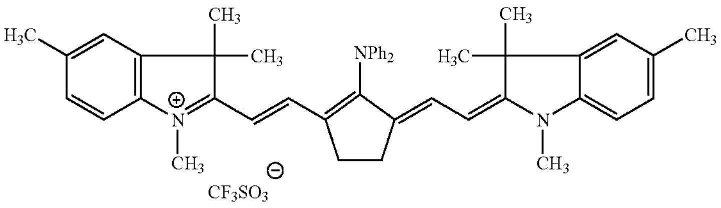

-continued
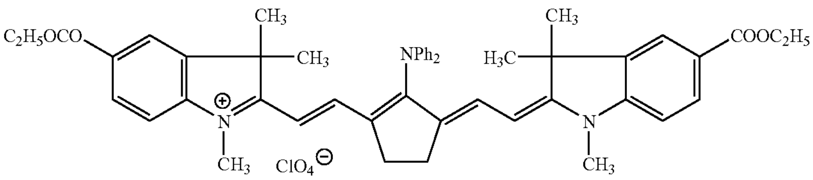
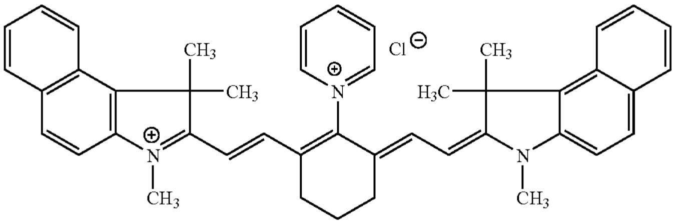
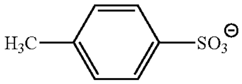
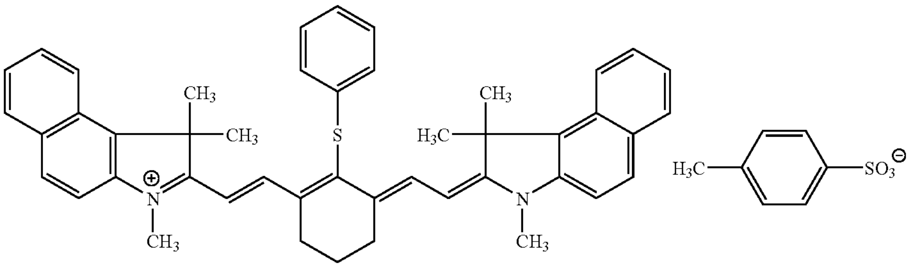
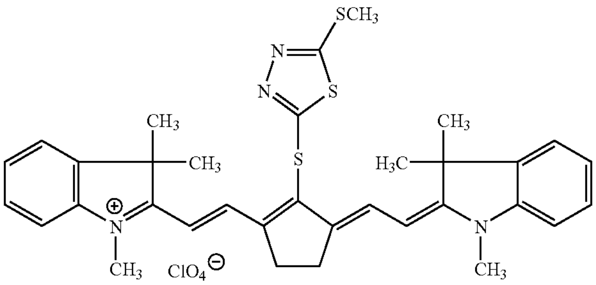
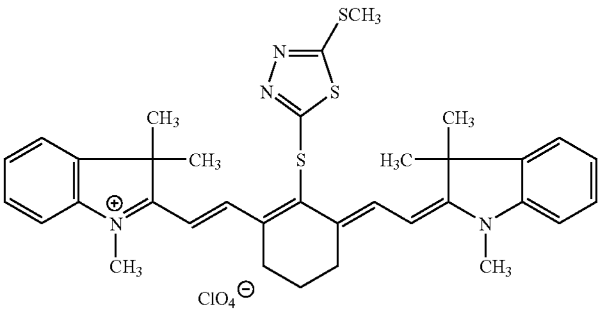
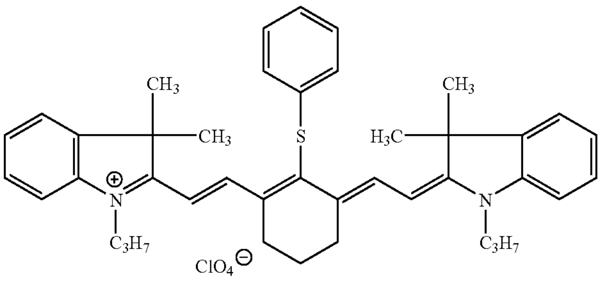

-continued
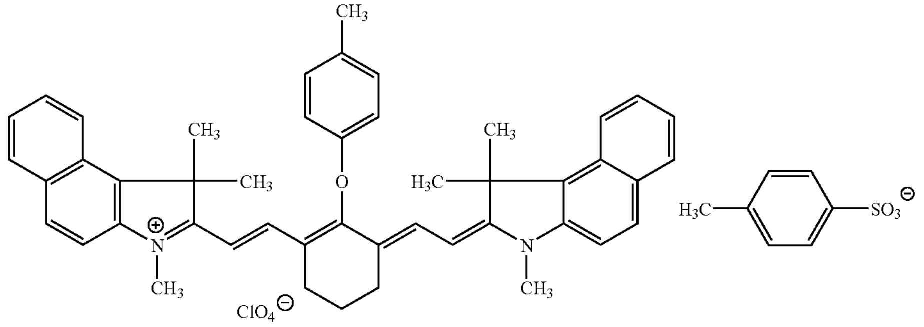
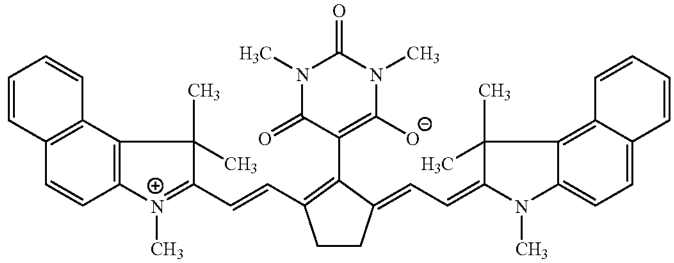
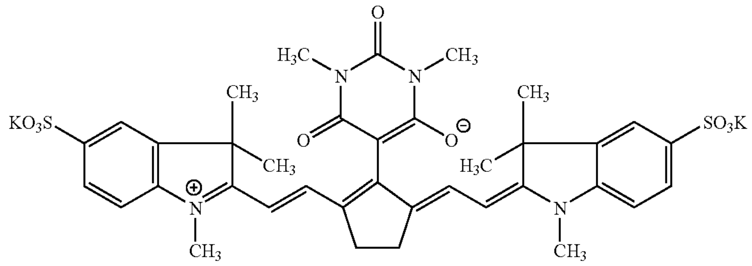
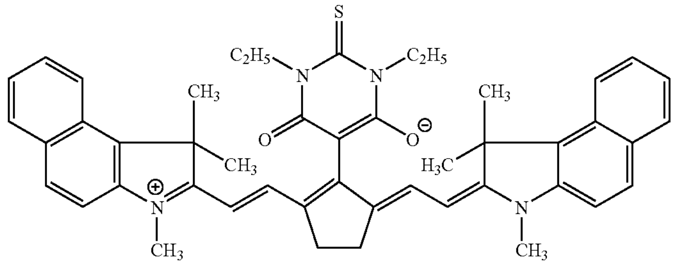
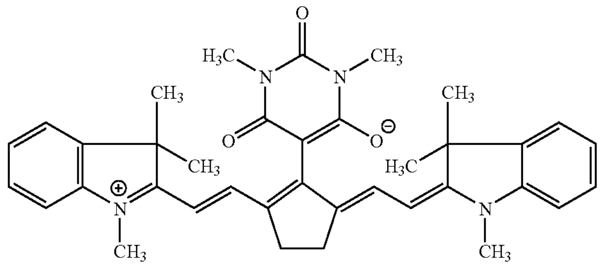
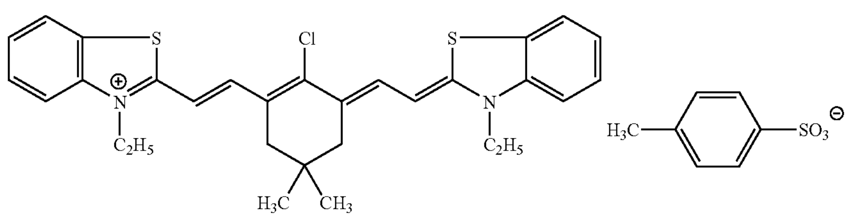

-continued

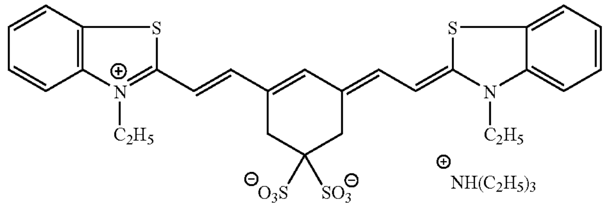

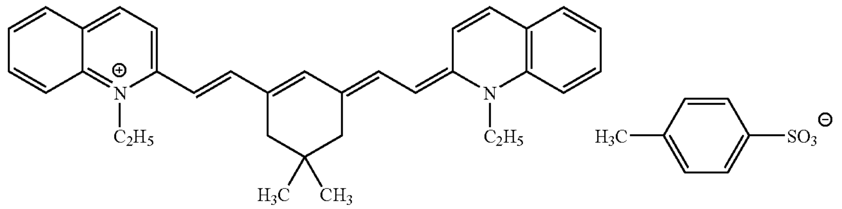

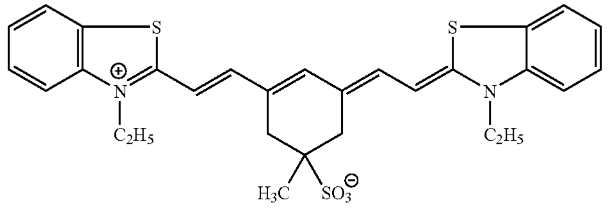

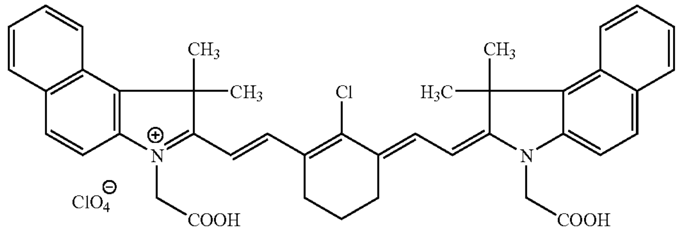

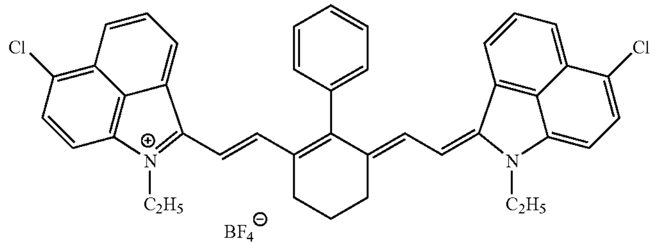

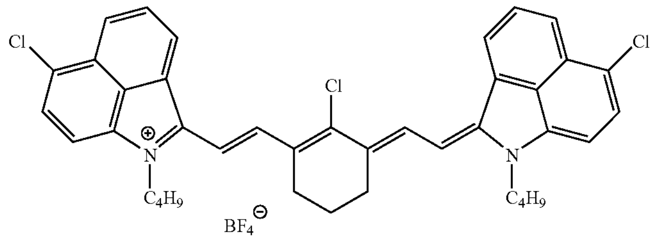

As other infrared absorbing agents, dyes having a plurality of chromophores described in JP-A-2001-242613, dyes wherein chromophores are bound to a high-molecular compound through a covalent bond as described in JP-A-2002-97384 and U.S. Pat. No. 6,124,425, anion dyes described in U.S. Pat. No. 6,248,893 and dyes having a surface orienting group as described in JP-A-2001-347765 may preferably be used.

Examples of the pigment used as the infrared absorbing agent in the invention include commercially available pigments and pigments described in Colour Index (C.I.), *Saishin Ganryo Binran* (Handbook of the Newest Pigments) compiled by Pigment Technology Society of Japan (1977), *Saishin Ganryo Oyou Gilutsu* (Newest Application on Technologies for Pigments), CMC Publishing Co., Ltd. (1986) and *Insatsu Ink Gijutsu* (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigments include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments, and carbon black. Of these pigments, carbon black is preferred.

The pigment may be surface treated or may not be surface treated before use. For the surface treatment, a method of coating resin or wax on the surface, a method of attaching a surfactant and a method of bonding a reactive substance (for example, a silane coupling agent, an epoxy compound and polyisocyanate) to the pigment. The surface treatment methods are described in *Kinzoku Sekken no Seishitsu to Oyo* (Properties and Applications of Metal Soap), Saiwai Shobo, *Insatsu Ink Gijutsu* (Printing Ink Technology), CMC Publishing Co., Ltd. (1984), and *Saishin Ganryo Oyo Gijutsu* (Newest Application on Technologies for Pigments), CMC Publishing Co., Ltd. (1986).

The pigment has a particle size of preferably from 0.01 μm to 10 μm, more preferably from 0.05 μm to 1 μm, particularly preferably from 0.1 μm to 1 μm. If the particle size of pigment is less than 0.01 μm, the dispersion is not stable in a coating solution for the image-forming layer, whereas if it exceeds 10 μm, it is not preferred in view of uniformity of the image-forming layer.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. These are described in detail in *Saishin Ganryo Oyo Gijutsu* (Newest Application on Technologies for Pigments), CMC Publishing Co., Ltd. (1986).

As the "infrared absorbing agent" component in the invention, the infrared absorbing agents may be used alone or in combination of two or more thereof.

As the "infrared absorbing agent" component in the invention, cyanine dyes are preferred.

From the standpoint of sensitivity, cyanine dyes represented by formula (a) are more preferred and, of the cyanine dyes represented by formula (a), cyanine dyes wherein $X^1$ represents a diarylamino group or $X^2$-$L^1$ are preferred, and cyanine dyes having a diarylamino group are more preferred.

Also, cyanine dyes having an electron attractive group or a heavy atom-containing substituent in the indolenine moieties on both ends are preferred. For example, those described in JP-A-2002-278057 are preferably used. Most preferred are cyanine dyes wherein $X^1$ represents a diarylamino group and which has an electron attractive group in the indolenine moieties on both ends.

(2) Compound Capable of Generating an Acid or a Radical

Compounds capable of generating an acid or a radical, which are used in the image-forming layer of the lithographic printing plate precursor of the invention, are described below.

(Compound Capable of Generating an Acid)

The compound capable of generating an acid (hereinafter also referred to as "acid-generating agent") is a compound, which generates an acid. The generated acid initiates or accelerates polymerization reaction of an addition-polymerizable compound described hereinafter.

The acid-generating agent is preferably an onium salt.

Examples of the acid-generating agent include diazonium salts (described in, S. I. Schlesinger, *Photogr. Sci. Eng.,* 18, 387 (1974), and T. S. Bal et al, *Polymer,* 21 423 (1980)), ammonium salts (described in U.S. Pat. Nos. 4,069,055 and 4,069,056, U.S. Reissued Pat. 27,922, and JP-A-4-365049), phosphonium salts (described in D. C. Necker et al, *Macromolecules,* 17, 2468 (1984), C. S. Wen et al, *Teh, Proc. Conf. Rad. Curing ASIA*, p 478, Tokyo, October (1988), U.S. Pat. Nos. 4,069,055 and 4,069,056), iodonium salts (J. V. Crivello et al, *Macromorecules,* 10(6), 1307 (1977), *Chem. & Eng. News*, November 28, p 31 (1988), European Patent 104143, U.S. Pat. Nos. 339,049 and 410,201, JP-A-2-150848 and JP-A-2-296514), sulfonium salts (described in J. V. Crivello et al, *Polymer J.* 17, 73 (1985), J. V. Crievello et al, *J. Org. Chem.,* 43, 3055 (1978), W. R. Watt et al, *J. Polymer Sci.*, Polymer Chem. Ed., 22, 1789 (1984), J. V. Crivello et al, *Polymer Bull.,* 14, 279 (1985), J. V. Crivello et al, *Macromorecules,* 14(5) 1141 (1981), J. V. Crivello et al, J. Polymer Sci., *Polymer Chem. Ed.,* 17, 2877 (1979), European Patents 370693, 3902114, 233567, 297443, 297442, U.S. Pat. Nos. 4,933,377, 161,811, 410,201, 339, 049, 4,760,013, 4,734,444, 2,833,827, German Patents 2904626, 3604580 and 3604581), selenonium salts (described in J. V. Crivello et al, *Macromolecules,* 10(6), 1307 (1977), and J. V. Crivello et al, *J. Polymer Sci., Polymer Chem. Ed.,* 17, 1047 (1979)), and arsonium salts (described in C. S. Wen et al, *Teh, Proc. Conf. Rad. Curing ASIA*, p 478 Tokyo, October (1988).

Examples of the counter ion for the onium salt include $BF_4$, $PF_6^-$, $AsF_6^-$ and $SbF_6^-$.

Other examples of the acid-generating agent include those described in JP-A-2001-277740, JP-A-2002-46361 and JP-A-2002-29162.

Also, the acid-generating agents may be used in combination of two or more thereof.

The addition amount of the acid-generating agent is preferably from 0.01 to 20% by weight, more preferably from 0.1 to 10% by weight, based on the amount of the total solid content of the image-forming layer.

(Compound Capable of Generating a Radical)

The compound capable of generating a radical (hereinafter also referred to as "radical-generating agent" means a compound which generates a radical and initiates or accelerates the polymerization of a compound having polymerizable unsaturated group. As the radical-generating agent used in the invention, known thermal polymerization initiators and compounds having a bond of small bond dissociation energy can be selectively used. Examples of the radical-generating agent include onium salts, triazine compounds having a trihalomethyl group, peroxides, azo polymerization initiators, azide compounds, quinonediazide compounds, and metallocene compounds described in JP-A-2002-137562, JP-A-2001-343742 and JP-A-2002-148790. The following onium salts are preferred because of high sensitivity.

The onium salts preferably used as radical-generating agent in the invention include diazonium salts, iodonium salts, sulfonium salts, ammonium salts and pyridinium salts. Of the onium salts, iodonium salts, diazonium salts and sulfonium salts are preferably used. In the invention, the onium salt functions not only as an acid-generating agent but also as an initiator of ionic radical polymerization based on different mechanism. The onium salts, which are preferably used as radical-generating agents, are those represented by formulae (II) to (IV) shown below.

(II)

$$Ar^{11}—I^{+}—Ar^{12}\quad Z^{11-}$$

(III)

$$Ar^{21}—N^{+}{=}N\quad Z^{21-}$$

(IV)

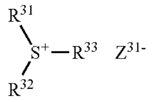

In formula (II), $Ar^{11}$ and $Ar^{12}$ each independently represents an aryl group having 20 or less carbon atoms, which may have a substituent. When the aryl group has a substituent, preferred examples of the substituent include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from a halogen ion, a perchlorate ion, a tetrafluoroborate ion, hexafluorophosphate ion, a sulfonate ion and a carboxylate ion, and is preferably a perchlorate ion, a hexafluorophosphate ion, an arylsulfonate ion or a carboxylate ion.

In formula (III), $Ar^{21}$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as defined for $Z^{11-}$.

In formula (IV), $R^{31}$, $R^{32}$ and $R^{33}$, which may be the same or different, each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms, and an aryloxy group having 12 or less carbon atoms. $Z^{31-}$ represents a counter ion having the same meaning as defined for $Z^{11-}$.

Specific examples of the onium salts ([OI-1] to [OI-10]) represented by the formula (II), the onium salts ([ON-1] to [ON-5]) represented by the formula (III), and the onium salts ([OS-1] to [OS-6]) represented by the formula (VI), which can be preferably used in the invention, are illustrated below but the onium salts used in the invention are not limited thereto.

[OI-1]

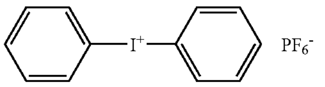

[OI-2]

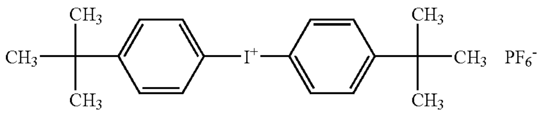

[OI-3]

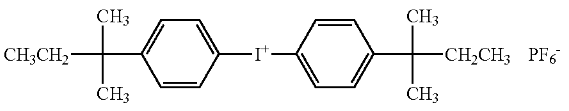

[OI-4]

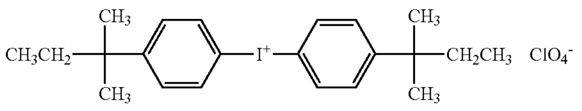

[OI-5]

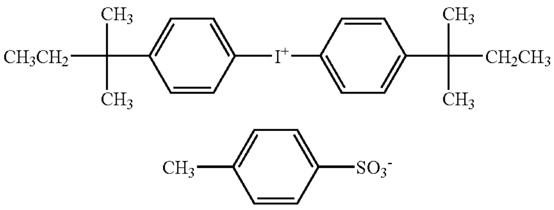

[OI-6]

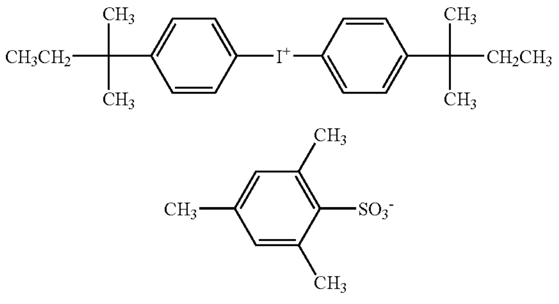

-continued
[OI-7]
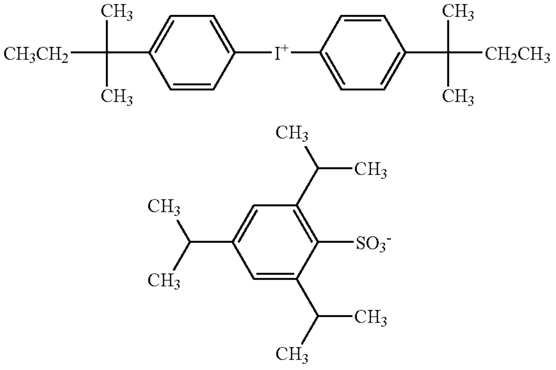
[OI-8]
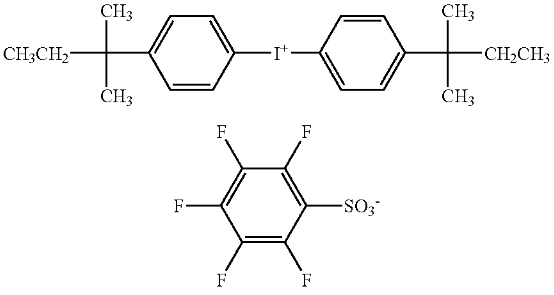
[OI-9]
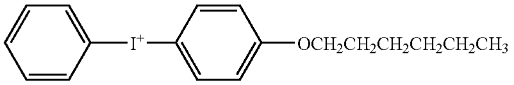
[OI-10]
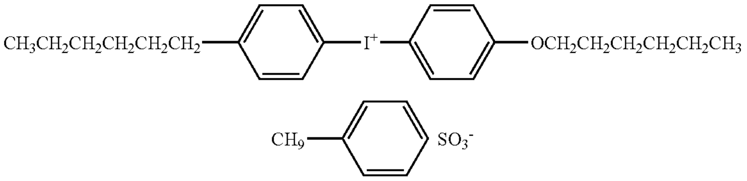
[ON-1]
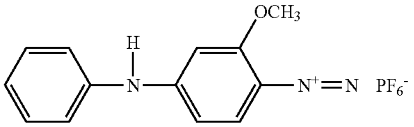
[ON-2]
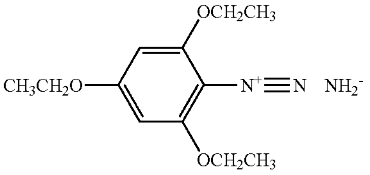
[ON-3]
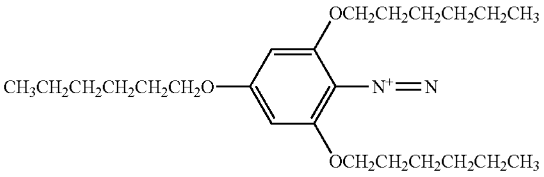
[ON-4]
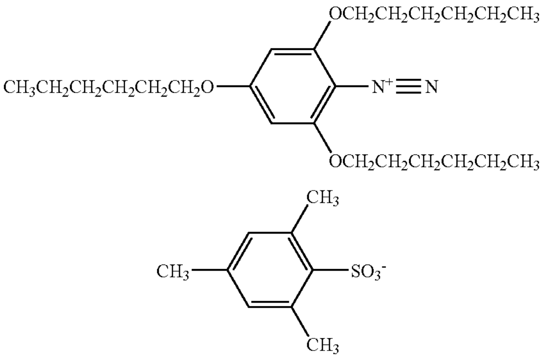

-continued

[ON-5]

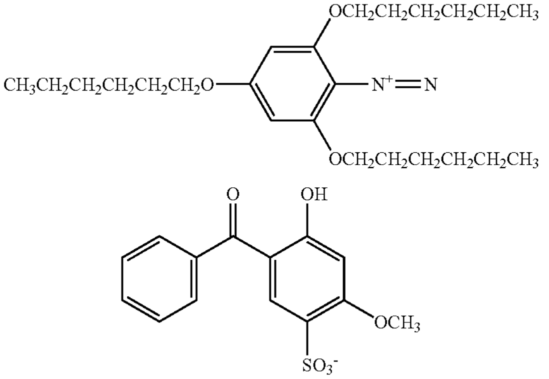

[OS-1]

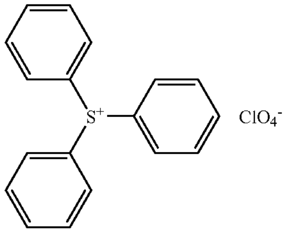

[OS-2]

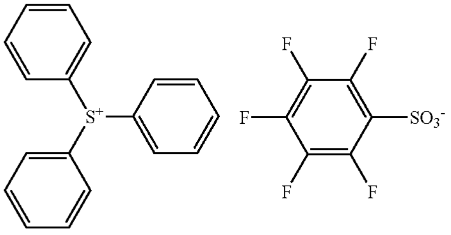

[OS-3]

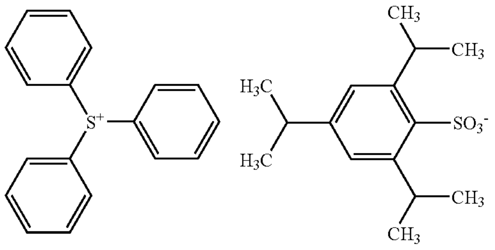

[OS-4]

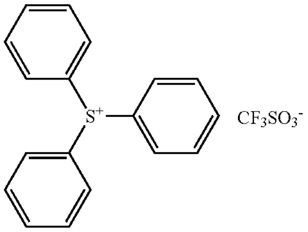

[OS-5]

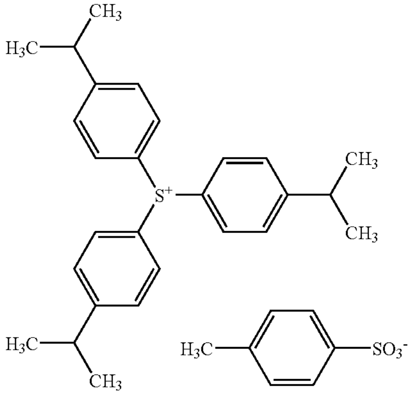

[OS-6]

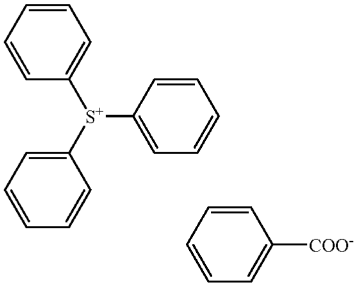

The onium salt as the radical-generating agent has the maximum absorption wavelength of preferably not longer than 400 nm, and more preferably not longer than 360 nm. By defining the absorption wavelength in the ultraviolet region as described above, the lithographic printing plate precursor can be handled under a white lamp.

The onium salt as the radical-generating agent can be added to the image-forming layer in an amount of from 0.1 to 50% by weight, preferably from 0.5 to 30% by weight, and particularly preferably from 1 to 20% by weight based on the amount of the total solid content of the image-forming layer. When the addition amount is more than 0.1% by weight, the sensitivity is more improved, and when the addition amount is less than 50% by weight, less stain occur in the non-image areas upon printing.

The onium salts as the radical-generating agents may be used alone or in combination of two or more thereof.

(3) Compound Capable of Undergoing Addition Polymerization with an Acid or a Radical The compound capable of undergoing addition polymerization with an acid or a radical (hereinafter also referred to as "polymerizable compound") used in the image-forming layer of the lithographic printing plate precursor of the invention is described below.

The polymerizable compound preferably has two or more polymerizable functional groups.

(Compound Capable of Undergoing Addition Polymerization with an Acid)

The compound capable of undergoing addition polymerization with an acid is not particularly limited, and includes a vinyl ether compound and a cyclic ether compound.

The vinyl ether compounds and cyclic ether compounds are described in JP-A-2001-277740, JP-A-2002-46361 and JP-A-2002-29162.

A cyclic ether in the cyclic ether compound is preferably a 3-membered epoxy group. Compounds having a plurality of cyclic ether groups are preferred. Commercially available epoxy compounds or epoxy resins may also be used.

Also, the vinyl ether compound preferably has a plurality of vinyl ether groups. The vinyl ether compound is preferably represented by the following formula (XIV):

$$L^5(\text{—O—CR}^5\text{=CR}^6R^7)_m \quad (XIV)$$

In formula (XIV), $L^5$ represents a m-valent linking group, $R^5$, $R^6$ and $R^7$ each independently represents a hydrogen atom, a halogen atom, an alkyl group or an aryl group, and m represents an integer of 2 or more.

When m represents 2, $L^5$ preferably represents a divalent group selected from an alkylene group, a substituted alkylene group, an arylene group, a substituted arylene group, a divalent heterocyclic group, —O—, —S—, —NH—, —Co—, —SO—, —$SO_2$— and a combination thereof.

The alkylene group may have a cyclic structure or a branched structure. The alkylene group has preferably 1 to 20 carbon atoms, more preferably 1 to 15 carbon atoms, still more preferably 1 to 10 carbon atoms, most preferably 1 to 8 carbon atoms.

Examples of the substituents for the substituted alkylene group and the substituted alkyl group include a halogen atom, an aryl group, a substituted aryl group and an alkoxy group.

The arylene group is preferably a phenylene group, most preferably a p-phenylene group.

The heterocyclic group may have a substituent.

Examples of the substituent for the substituted arylene group, the substituted aryl group and the substituted heterocyclic group include a halogen atom, an alkyl group, a substituted alkyl group, an aryl group, a substituted aryl group and an alkoxy group.

When m represents 3 or more, $L^5$ preferably represents an aliphatic group having 3 or more valences, an aromatic group having 3 or more valences, a heterocyclic group having 3 or more valences, or a combination of one or more thereof with an alkylene group, a substituted alkylene group, an arylene group, a substituted arylene group, a divalent heterocyclic group, —O—, —S—, —NH—, —Co—, —SO—or —$SO_2$—.

The aliphatic group having 3 or more valences may have a cyclic structure or a branched structure. The aliphatic group has preferably 1 to 20 carbon atoms, more preferably 1 to 15 carbon atoms, still more preferably 1 to 10 carbon atoms, most preferably 1 to 8 carbon atoms.

The aliphatic group may have a substituent. Examples of the substituent include a halogen atom, an aryl group, a substituted aryl group and an alkoxy group.

The aromatic group is preferably a benzene ring residue. The aromatic group may have a substituent. Examples of the substituent include a halogen atom, an alkyl group, a substituted alkyl group, an aryl group, a substituted aryl group and an alkoxy group.

The heterocyclic group may have a substituent. Examples of the substituent include a halogen atom, an alkyl group, a substituted alkyl group, an aryl group, a substituted aryl group and an alkoxy group.

$L^5$ may constitute a main chain of a polymer comprising m repeating units.

$R^5$, $R^6$ and $R^7$ each independently represents preferably a hydrogen atom, a halogen atom or an alkyl group, more preferably a hydrogen atom, a halogen atom or an alkyl group having 1 to 6 carbon atoms, still more preferably a hydrogen atom or an alkyl group having 1 to 3 carbon atoms, yet more preferably a hydrogen atom or a methyl group, most preferably a hydrogen atom.

(Compound Capable of Undergoing Addition Polymerization with a Radical)

The compound capable of undergoing addition polymerization with a radical is not particularly limited and includes an ethylenically unsaturated polymerizable compound.

The ethylenically unsaturated polymerizable compound has preferably a plurality of ethylenically unsaturated groups (having two or more functional groups), more preferably 3 or more ethylenically unsaturated groups (having three or more functional groups), still more preferably 4 or more functional groups, yet more preferably 5 or more functional groups, most preferably 6 or more functional groups.

The ethylenically unsaturated polymerizable compound is preferably represented by the following formula (I):

$$(L^1(\text{—CR}^1\text{=CR}^2R^3)_m \quad (I)$$

In formula (I), $L^1$ represents a m-valent linking group, $R^1$, $R^2$ and $R^3$ each independently represents a hydrogen atom, a halogen atom, an alkyl group or an aryl group, and m represents an integer of 2 or more.

When m represents 2, $L^1$ preferably represents a divalent group selected from an alkylene group, a substituted alkylene group, an arylene group, a substituted arylene group, a divalent heterocyclic group, —O—, —S—, —NH—, —NR—, —Co—, SO—, —$SO_2$— and a combination thereof. R represents an alkyl group, a substituted alkyl group, an aryl group or a substituted aryl group.

The alkylene group and the alkyl group may have a cyclic structure or a branched structure. The alkylene group and the alkyl group have preferably 1 to 20 carbon atoms, more preferably 1 to 15 carbon atoms, still more preferably 1 to 10 carbon atoms, most preferably 1 to 8 carbon atoms.

Examples of the substituent for the substituted alkylene group and the substituted alkyl group include a halogen atom, an aryl group, a substituted aryl group and an alkoxy group.

The arylene group is preferably a phenylene group, most preferably a p-phenylene group. The aryl group is preferably a phenyl group.

The divalent heterocyclic group may have a substituent.

Examples of the substituent for the substituted arylene group, the substituted aryl group and the substituted heterocyclic group include a halogen atom, an alkyl group, a substituted alkyl group, an aryl group, a substituted aryl group and an alkoxy group.

When m represents 3 or more, $L^1$ preferably represents an aliphatic group having 3 or more valences, an aromatic group having 3 or more valences, a heterocyclic group having 3 or more valences, or a combination of one or more thereof with an alkylene group, a substituted alkylene group, an arylene group, a substituted arylene group, a divalent hetero ring group, —O—, —S—, —NH—, —NR—, —N<, —Co—, —SO—or —$SO_2$—. R represents an alkyl group, a substituted alkyl group, an aryl group or a substituted aryl group.

The aliphatic group having 3 or more valences may have a cyclic structure or a branched structure. The aliphatic group has preferably 1 to 20 carbon atoms, more preferably 1 to 15 carbon atoms, still more preferably 1 to 10 carbon atoms, most preferably 1 to 8 carbon atoms.

The aliphatic group may have a substituent. Examples of the substituent include a halogen atom, an aryl group, a substituted aryl group and an alkoxy group.

The aromatic group is preferably a benzene ring residue. The aromatic group may have a substituent. Examples of the substituent include a halogen atom, an alkyl group, a substituted alkyl group, an aryl group, a substituted aryl group and an alkoxy group.

The heterocyclic group may have a substituent. Examples of the substituent include a halogen atom, an alkyl group, a substituted alkyl group, an aryl group, a substituted aryl group, an alkoxy group, an oxo (=O) group and a thio (=S) group.

$L^1$ may constitute a main chain of a polymer comprising m repeating units.

$R^1$, $R^2$ and $R^3$ each independently represents preferably a hydrogen atom, a halogen atom or an alkyl group, more preferably a hydrogen atom, a halogen atom or an alkyl group having 1 to 6 carbon atoms, still more preferably a hydrogen atom or an alkyl group having 1 to 3 carbon atoms, yet more preferably a hydrogen atom or a methyl group, most preferably a hydrogen atom.

When the linking group $L^1$ in formula (I) contains a urethane bond (—NH—CO—O— or NR—CO—O— wherein R represents an alkyl group, a substituted alkyl group, an aryl group or a substituted aryl group), there can be formed a polymer image having excellent printing durability. Compounds having the urethane bond are described in JP-A-51-37193, JP-B-2-32293 and JP-A-2001-117217.

The linking group $L^1$ in formula (I) may be a partial structure having liquid crystal properties. In other words, liquid crystal compounds having an ethylenically unsaturated group (—$CR^1$=$CR^2R^3$ in formula (I)) may be used as the polymerizable compound. The liquid crystal compounds having a polymerizable group are commonly used in the field of optical materials, particularly in the production of retardation plates and optical compensating sheets.

The liquid crystal compound having an ethylenically unsaturated group has a melting point of preferably from 30 to 300° C., more preferably from 50 to 270° C., still more preferably from 70 to 240° C., most preferably from 90 to 210° C.

The proportion of ethylenically unsaturated group contained in the liquid crystal compound is preferably 5.0 mmol or more, more preferably 7.0 mmol or more, per g of the liquid crystal compound.

The liquid crystal compound is preferably a rod-like liquid crystal compound or a discotic liquid crystal compound. The liquid crystal compound may be a high-molecular liquid crystal compound.

As the rod-like liquid crystal compound, azomethines, azoxy compounds, cyanobiphenyls, cyanophenyl esters, benzoates, phenyl cyclohexanecarboxylates, cyanophenylcyclohexanes, cyano-substituted phenylpyridines, alkoxy-substituted phenylpyridines, phenyldioxanes, tolans and alkenylcyclohexylbenzonitriles are preferred.

The rod-like liquid crystal compound include a metal complex. Also, a liquid crystal polymer containing a rod-like liquid crystal compound in the repeating unit may be used as the rod-like liquid crystal compound. In other words, the rod-like liquid crystal compound may be bound to a (liquid crystal) polymer.

The rod-like liquid crystal compounds are described in *Kikan Kaqaku Sosetsu* (Quarterly Introduction to Chemistry), vol. 22, Ekisho no Kagaku (1994), compiled by Nihon Kagakukai, chapters 4, 7 and 11; and *Ekisho Device Handbook* (Handbook of Liquid Crystal Devices), compiled by 142th Iinkai of Nihon Gakujutsu Sinkokai, chapter 3.

The rod-like liquid crystal compound preferably has two ethylenically unsaturated groups on both ends of the rod-like molecular structure.

Discotic liquid crystal compound is more preferred than the rod-like liquid crystal compound. Specifically, the liquid crystal compound preferably has many ethylenically unsaturated groups. The discotic liquid crystal compound (ordinarily being capable of having 4 or more ethylenically unsaturated groups) can have more ethylenically unsaturated groups than the rod-like liquid crystal compound (ordinarily having 2 or less ethylenically unsaturated groups).

Examples of the discotic liquid crystal compound include benzene derivatives described in Study Reports of C. Destrade et al, *Mol. Cryst.* vol. 71, p. 111 (1981), truxene derivatives described in Study Reports of C. Destrade et al, *Mol. Cryst.* vol. 122, p. 141 (1985), and Physicslett, A, vol. 78, p. 82 (1990), cyclohexane derivatives described in study Reports of B. Kohne et al, *Angew. Chem.*, vol. 96, p. 70 (1984), and azacrown-series or phenylacetylene-series macrocycles described in Study Reports of J. M. Lehn et al, *J. Chem. Commun.*, p. 1794 (1985), Study Reports of J. Zhang et al, *J. Am. Chem. Soc.*, vol. 116, p. 2655 (1994).

The discotic liquid crystal compound is a compound which has, as an ordinary molecular structure, a structure wherein the above-described mother nucleus at the molecular center is substituted by a straight-chain alkyl or alkoxy group or a substituted benzoyloxy group in a radial pattern, and which shows liquid crystal properties.

Examples of the discotic liquid crystal compound are described in JP-A-8-50206. The discotic liquid crystal compounds having a polymerizable group are described in JP-A-8-27284.

In order to introduce the ethylenically unsaturated group into the discotic liquid crystal compound, it is required to bind the ethylenically unsaturated group as a substituent to the discotic core of the discotic liquid crystal compound. However, direct bonding of the ethylenically unsaturated group to the discotic core makes it difficult to keep the oriented state in the polymerization reaction. Thus, it is preferred to introduce a linking group between the discotic core and the ethylenically unsaturated group. Therefore, the discotic liquid crystal compound having the ethylenically unsaturated group is preferably represented by the following formula (II):

$$D(\text{-L-Q})_n \qquad \text{(II)}$$

wherein D represents a discotic core, L represents a divalent linking group, 0 represents an ethylenically unsaturated group (—$CR^1$=$CR^2R^3$ in the foregoing formula (I)), and n represents an integer of 4 to 12.

Examples of the discotic core (D) are illustrated below. In each example, LQ (or QL) means a combination of the divalent linking group (L) and the ethylenically unsaturated group (Q).
(D1)
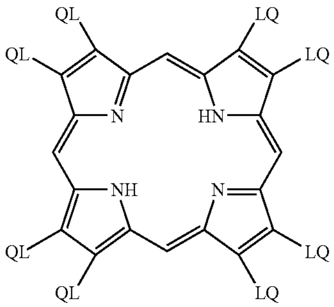
(D2)
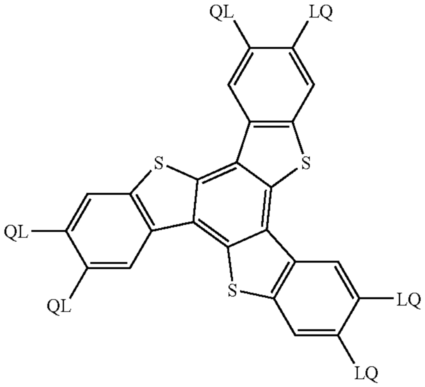
(D3)
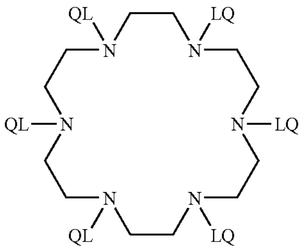
(D4)
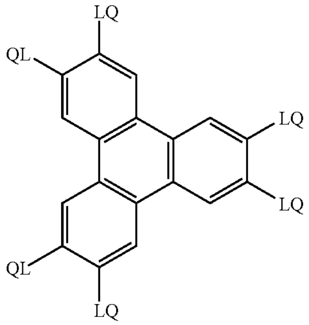
-continued
(D5)
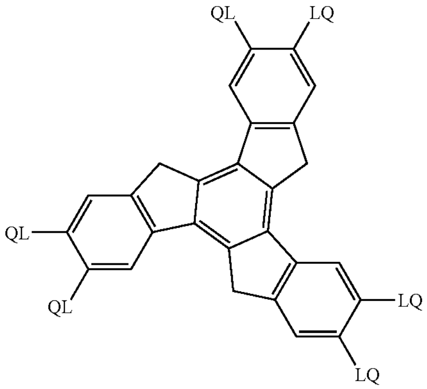
(D6)
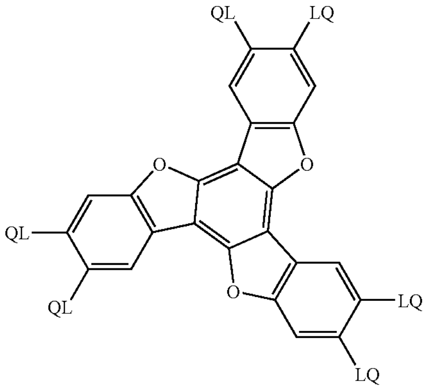
(D7)
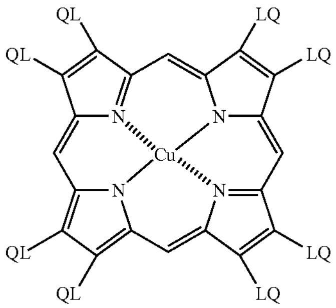
(D8)
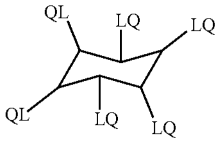
(D9)
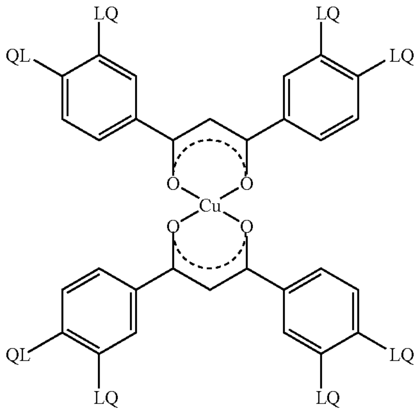

-continued (D10)

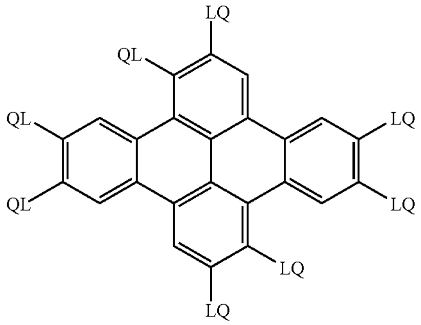

(D11)

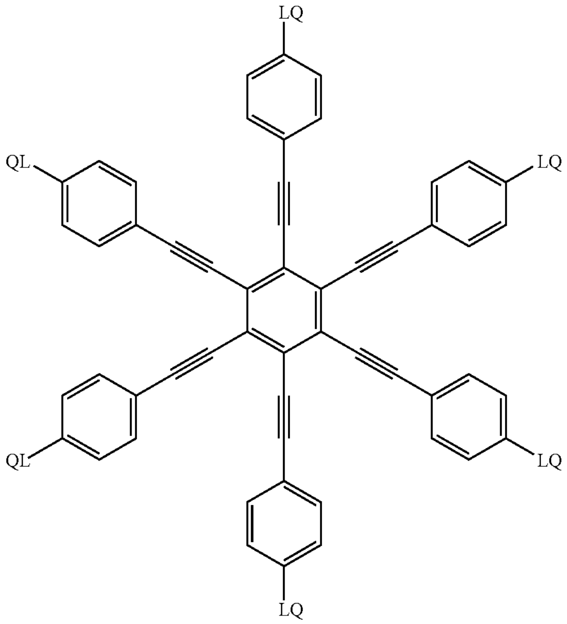

(D12)

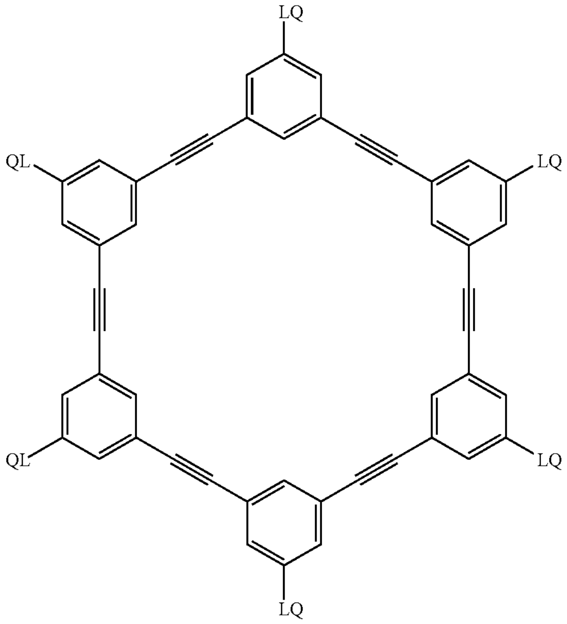

-continued (D13)

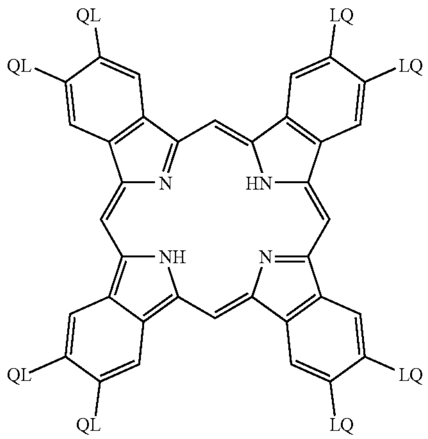

(D14)

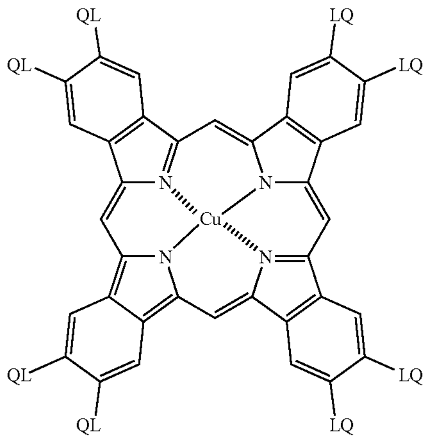

(D15)

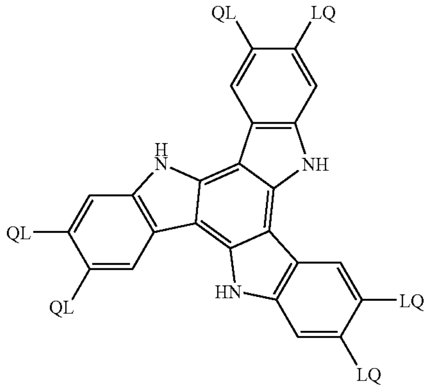

In formula (II), the divalent linking group (L) preferably represents a divalent linking group selected from an alkylene group, an alkenylene group, an arylene group, —CO—, NH—, —O—, —S— and a combination thereof. The divalent linking group (L) more preferably represents a divalent linking group formed by combining at least two divalent groups selected from an alkylene group, an arylene group, —CO—, NH—, —O— and —S—. The divalent linking group (L) most preferably represents a divalent linking group formed by combining at least two divalent groups selected from an alkylene group, an arylene group, —CO— and —O—. The alkylene group has preferably 1 to 12 carbon atoms. The alkenylene group has preferably 2 to 12 carbon atoms. The arylene group has preferably 6 to 10 carbon atoms.

Examples of the divalent linking group (L) are illustrated below. In each group the left side is bound to the discotic core (D), and the right side is bound to the polymerizable group (Q). AL represents an alkylene group or an alkenylene group, and Ar represents an arylene group. The alkylene group, alkenylene group and arylene group may have a substituent (for example, an alkyl group).

L1: -AL-CO—O-AL-
L2: -AL-CO—O-AL-O—
L3: -AL-CO—O-AL-O-AL-
L4: -AL-CO—O-AL-O—CO—
L5: —CO-AR—O-AL-
L6: —CO-AR—O-AL-O—
L7: —CO-AR—O-AL-O—CO—
L8: —CO—NH-AL-
L9: —NH-AL-O—
L10: —NH-AL-O—CO—
L11: —O-AL-
L12: —O-AL-O—
L13: —O-AL-O—CO—
L14: —O-AL-O—CO—NH-AL-
L15: —O-AL-S-AL-
L16: —O—CO-AR—(O-AL)m-
L17: —O—CO-AR—(O-AL)m-O—
L18: —O—CO-AR—(O-AL)m-CO—
L19: —O—CO-AR—(OAL)m-O—CO—
L20: —S-AL-
L21: —S-AL-O—
L22: —S-AL-O—CO—
L23: —S-AL-S-AL-
L24: —S-AR—AL- (Note) m: an integer of 1 to 6

In formula (II), n represents an integer of 4 to 12. Specific number is determined depending upon kind of the discotic core (D). Plural combinations of L and Q may be different, but are preferably the same.

It is also preferred for the linking group $L^1$ in formula (I) to have a cyclic amide structure The cyclic amide structure is preferably a 5-membered ring or a 6-membered ring.

The cyclic structure preferably has a plurality of amido bonds, more preferably 3 or more amido bonds.

Examples of the cyclic amide structure include a 2-imidazolidinone ring (ethylene-urea ring), a trimethylene urea ring, a 2,4-imidazolidinedione ring, a 2,4-thiazolidinedione ring, a hexahydro-1,3,5-triazinedione ring, a 2,4,5-imidazolidinetrione ring, a tetrahydro-1,2,4-triazoledione ring, a 2-oxazolidione ring, an uracil ring, a barbituric acid ring and an isocyanuric acid ring. Preferred examples thereof include a hexahydro-1,3,5-triazinedione ring, a uracil ring, a barbituric acid ring and an isocyanuric acid ring, more preferred examples thereof include a barbituric acid ring and an isocyanuric acid, and the most preferred example thereof includes an isocyanuric acid ring.

The cyclic amide may have a substituent in addition to the ethylenically unsaturated group or a linking group to other cyclic amide. Examples of the substituent are the same as those exemplified as substituents for the heterocyclic group in formula (I).

The cyclic amide shows tautomerism between a keto form (e.g., isocyanuric acid) and an enol-form (e.g., cyanuric acid). The name of cyclic amide means a keto form, but the cyclic amide may be in an enol-form cyclic structure.

The linking group $L^1$ in formula (I) more preferably contains a plurality of cyclic amide structures. A plurality of the cyclic amide structures are bound preferably through a linking group rather than directly. The cyclic amide structure and the ethylenically unsaturated group are also bound to each other preferably through a linking group rather than directly.

The polymerizable compound containing a plurality of cyclic amide structures is preferably represented by the following formula (III):

$$L^3[\text{-Cy}\{\text{-}L^8(\text{-Q})_r\}_q]_p \quad \text{(III)}$$

In formula (III), $L^3$ represents a p-valent linking group, and p represents an integer of 2 or more. Definition of the linking group is the same as $L^1$ in formula (I).

Examples of $L^3$ are illustrated below.

L31

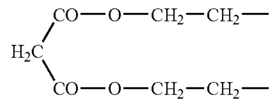

(p = 2)

L32

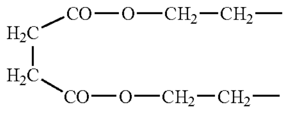

(p = 2)

L33

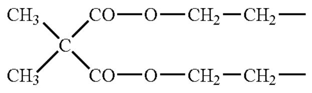

(p = 2)

L34

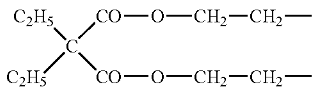

(p = 2)

L35

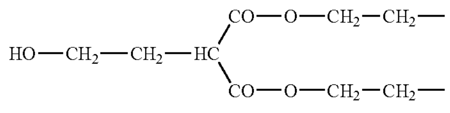

(p = 2)

L36

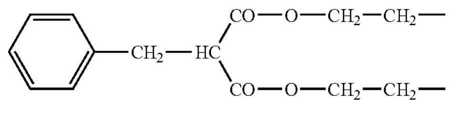

(p = 2)

L37

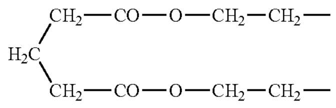

(p = 2)

L38

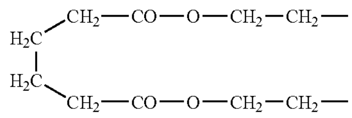

(p = 2)

-continued
L39
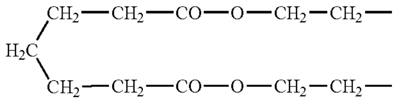
(p = 2)
L40
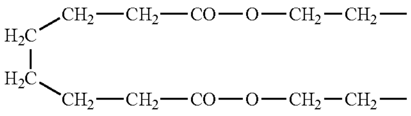
(p = 2)
L41
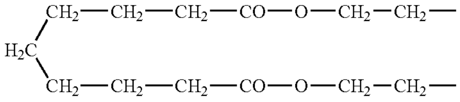
(p = 2)
L42
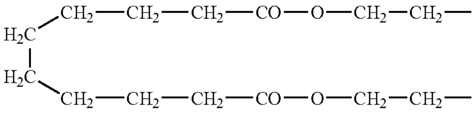
(p = 2)
L43
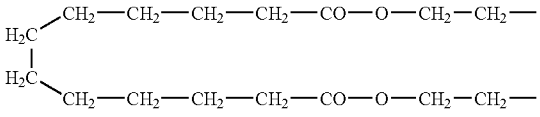
(p = 2)
L44
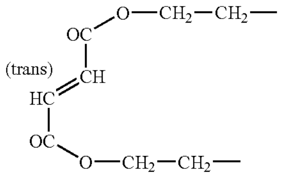
(p = 2)
L45
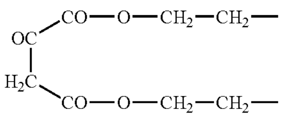
(p = 2)
L46
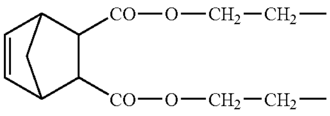
(p = 2)
L47
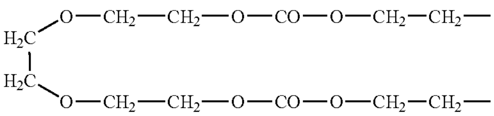
(p = 2)
-continued
L48
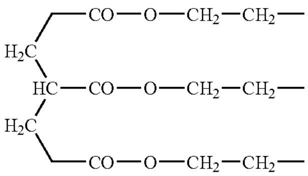
(p = 3)
L49
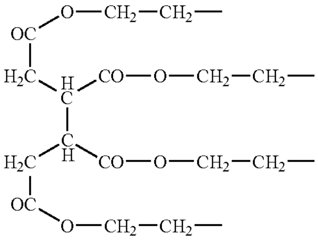
(p = 4)
L50
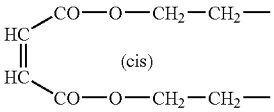
(p = 2)
L51
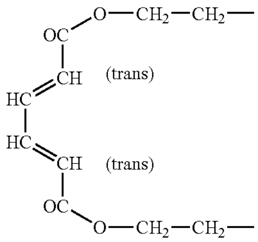
(p = 2)
L52
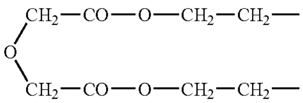
(p = 2)
L53
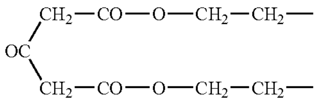
(p = 2)
L54
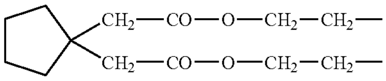
(p = 2)
L55
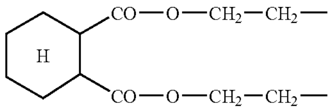
(p = 2)

-continued
L56
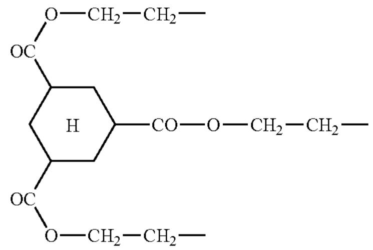
(p = 2)
L57
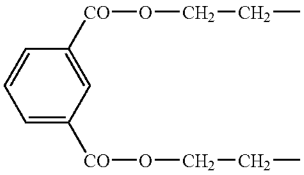
(p = 2)
L58
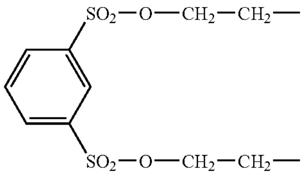
(p = 2)
L59
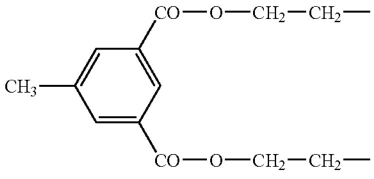
(p = 2)
L60
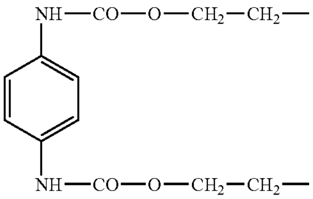
(p = 2)
L61
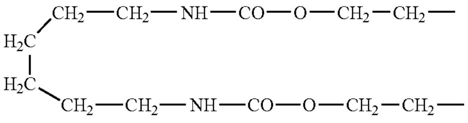
(p = 2)
L62
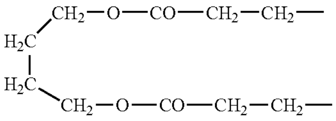
(p = 2)
-continued
L63
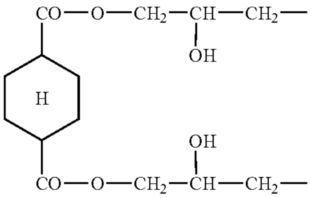
(p = 2)
L64
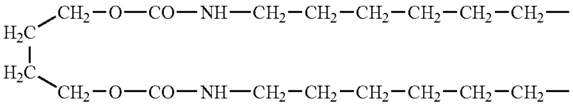
(p = 2)
L65
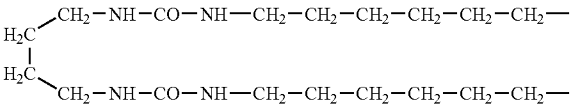
(p = 2)
L66
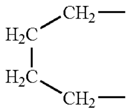
(p = 2)
L67
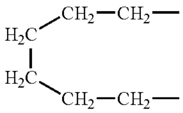
(p = 2)
L68
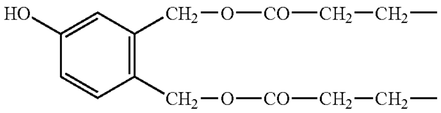
(p = 2)
L69
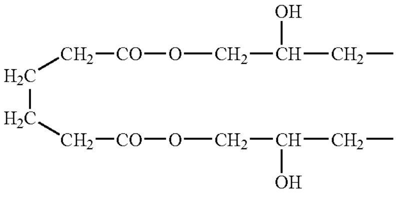
(p = 2)
L70
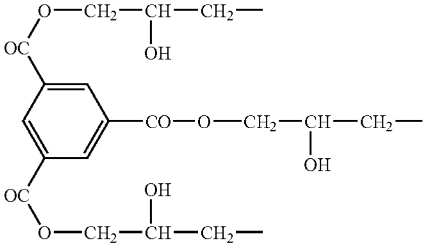
(p = 3)

-continued

L71

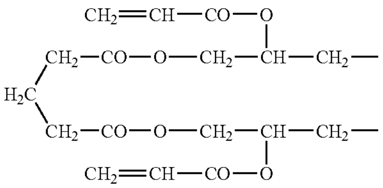

(p = 2)

L72

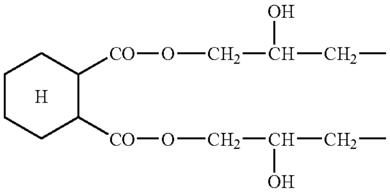

(p = 2)

L73

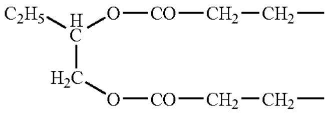

(p = 2)

L74

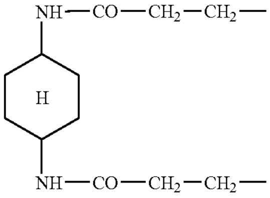

(p = 2)

L75

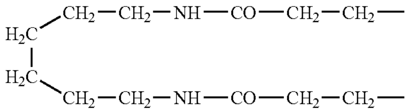

(p = 2)

L76

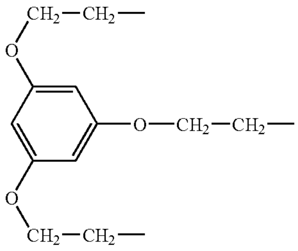

(p = 3)

In formula (III), Cy represents a (q+1)-valent cyclic amide, and q represents an integer of 1 or more.

Examples of Cy are illustrated below.

Cy1

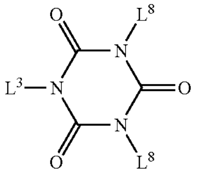

(q = 2)

Cy2

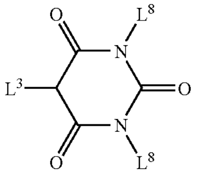

(q = 2)

Cy3

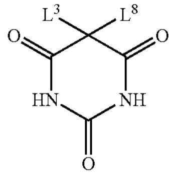

(q = 1)

Cy4

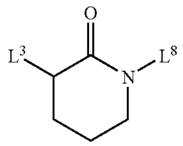

(q = 1)

In formula (III), $L^8$ represents an r-valent linking group, and r represents an integer of 1 or more. Definition of the linking group is the same as $L^1$ in formula (I).

Examples of L8 are illustrated below.

L81

$Cy—CH_2—CH_2—O—CO—Q$ (r = 1)

L82

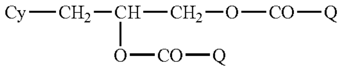

(r = 2)

L83

$Cy—CH_2—CH_2—CO—O—CH_2—CH_2—O—CO—Q$ (r = 1)

L84

$Cy—CH_2—CH_2—O—CO—NH—O—CO—Q$ (r = 1)

L85

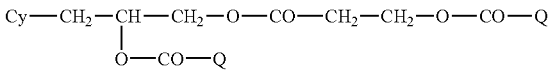

(r = 2)

L86

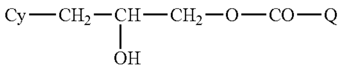

(r = 1)

-continued

L87

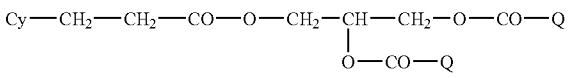

(r = 2)

L88

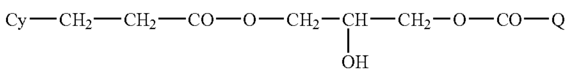

(r = 1)

L89

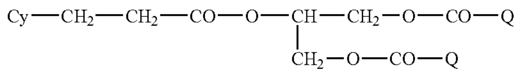

(r = 2)

L90

$Cy—(CH_2)_6—NH—CO—O—CH_2—CH_2—O—CO—Q$ (r = 1)

L91

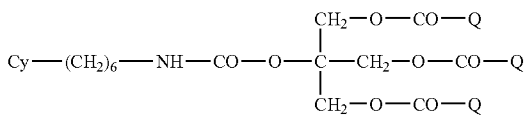

(r = 3)

L92

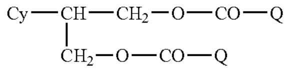

(r = 2)

L93

$Cy—CH_2—CH_2—CH_2—CO—O—Q$ (r = 1)

Examples of theethylenically unsaturated polymerizable compound containing a plurality of cyclic amide structures are illustrated below. In the following examples, numbers referring to illustrative examples of L3, Cy and L8 in formula (III) are cited. Vi means a vinyl group, iPr means an isopropenyl group, and these groups are the ethylenically unsaturated polymerizable groups.

M-1: L31[-Cy1{-L84-Vi}$_2$]$_2$
M-2: L32[-Cy1{-L81-Vi}$_2$]$_2$
N-3: L33[-Cy1{-L81-Vi}$_2$]$_2$
M-4: L34[-Cy1{-L81-Vi}$_2$]$_2$
M-5: L35[-Cy1{-L81-iPr}$_2$]$_2$
M-6: L36[-Cy1{-L81-iPr}$_2$]$_2$
M-7: L37[-Cy1{-L81-Vi}$_2$]$_2$
M-8: L38[-Cy2{-L81-Vi}$_2$]$_2$
M-9: L39[-Cy1{-L81-Vi}$_2$]$_2$
M-10: L40[-Cy1{-L81-Vi}$_2$]$_2$
M-11: L41[-Cy1{-L81-iPr}$_2$]$_2$
M-12: L42[-Cy1{-L81-iPr}$_2$]$_2$
M-13: L43[-Cy1{-L81-Vi}$_2$]$_2$
M-14: L44[-Cy1{-L81-Vi}$_2$]$_2$
M-15: L45[-Cy1{-L81-Vi}$_2$]$_2$
M-16: L46[-Cy1{-L81-Vi}$_2$]$_2$
M-17: L47[-Cy1{-L81-Vi}$_2$]$_2$
M-18: L48[-Cy1{-L81-iPr}$_2$]$_2$
M-19: L49[-Cy1{-L81-Vi}$_2$]$_2$
M-20: L50[-Cy1{-L81-Vi}$_2$]$_2$
M-21: L51[-Cy1{-L81-Vi}$_2$]$_2$
M-22: L52[-Cy1{-L81-Vi}$_2$]$_2$
M-23: L53[-Cy1{-L81-Vi}$_2$]$_2$
M-24: L54[-Cy2{-L81-Vi}$_2$]$_2$
M-25: L55[-Cy1{-L81-Vi}$_2$]$_2$
M-26: L56[-Cy1{-L81-Vi}$_2$]$_2$
M-27: L57[-Cy1{-L81-Vi}$_2$]$_2$
M-28: L58[-Cy1{-L81-Vi}$_2$]$_2$
M-29: L59[-Cy1{-L81-Vi}$_2$]$_2$
M-30: L60[-Cy1{-L81-Vi}$_2$]$_2$
M-31: L61[-Cy1{-L81-Vi}$_2$]$_2$
M-32: L62[-Cy1{-L83-Vi}$_2$]$_2$
M-33: L63[-Cy1{-L82-Vi)$_2$}$_2$]$_2$
M-34: L64[-Cy1{-L90-Vi}$_2$]$_2$
M-35: L65[-Cy1{-L91(-Vi)$_3$}$_2$]$_2$
M-36: L66[-Cy2{-L92(-Vi)$_2$}$_2$]$_2$
M-37: L67[-Cy3-L93-Vi]$_2$
M-38: L67[-Cy4-L81-Vi]$_2$
M-39: L68[-Cy1{-L89(-Vi)(-iPr)}$_2$]$_2$
M-40: L39[-Cy1{-L84-Vi}$_2$]$_2$
M-41: L69[-Cy1{-L85-Vi}$_2$]$_2$
M-42: L70[-Cy1{-L82(-Vi)(-iPr)}$_2$]$_2$
M-43: L71[-Cy1{-L82(-Vi)$_2$}$_2$]$_2$
M-44: L72[-Cy1{-L86-Vi}$_2$]$_2$
M-45: L73[-Cy1{-L87(-Vi)$_2$}$_2$]$_2$
M-46: L74[-Cy1{-L87(-Vi) (-iPr)}$_2$]$_2$
M-47: L75[-Cy1{-L89(-iPr)$_2$}$_2$]$_2$
M-48: L76[-Cy1{-L81-Vi}$_2$]$_3$

The ethylenically unsaturated polymerizable compounds have a molecular weight of preferably 400 or more, still more preferably from 600 to 3,000.

Two or more of the polymerizable compounds may be used in combination.

The image-forming layer contains the ethylenically unsaturated compound in an amount of from 5 to 80% by weight, more preferably from 10 to 70% by weight, still more preferably from 15 to 60% by weight, most preferably from 20 to 50% by weight.

(5) Polymer Binder

The image-forming layer of the lithographic printing plate precursor of the invention may contain a polymer binder.

As the polymer binder, conventionally known polymer binders may be used with no particular limitation. The polymer binder may be a hydrophobic polymer or a hydrophilic polymer, but is preferably a hydrophobic polymer.

The main chain of binder polymer is preferably selected from hydrocarbons (polyolefins), polyesters, polyamides, polyimides, polyureas, polyethers and a combination thereof, The main chain more preferably contains a hydrocarbon or a polyurethane. The polymer comprising a hydrocarbon main chain is preferably poly(meth)acrylic acid, poly(meth)acrylate, poly(meth)acrylamide, poly(meth)acrylonitrile, polystyrene, polyvinyl acetal or a copolymer thereof. Polyvinyl acetal and polyurethane are particularly preferred.

Various polymers used in the image-forming layer are described in *POLYMER HANDBOOK*, FOURTH EDITION, compiled by J. BRANDRUP, E. H. IMMERGUT, and E. A. RULKE, JOHN WILEY & SONS, INC.

The binder polymer preferably does not contain an acidic group. Polymers containing an acidic group are in some cases adsorbed on a support and inhibit on-machine development. The acidic group means a group having an acid dissociation constant of less than 7, such as —COOH, —$SO_3H$, —$OSO_3H$, —$PO_3H_2$ or —$OPO_3H_2$.

The polymer has a glass transition temperature (Tg) of preferably from 50 to 300° C., more preferably from 70 to 250° C., most preferably from 80 to 200° C. In order to increase the glass transition temperature of the polymer, it is possible to introduce amido bond (—NRCO—), imido bond (—N═CO—), urethane bond (—NRCOO—), urea bond (—NRCONR—), sulfonamide bond (—$SO_2$NR—), sulfonyl bond (—$SO_2$—) or cyano group (—CN) into side chains of the polymer. R represents a hydrogen atom or a hydrocarbon group. Binder polymers having a side chain containing the function of increasing the glass transition temperature are described in JP-A-2000-250216, JP-A-2001-51408, JP-A-2001-109138, JP-A-2001-242612, JP-A-2002-122984, and JP-A-2002-122989.

The binder polymer preferably has an addition polymerizable group in its side chain. The addition polymerizable group is preferably an ethylenically unsaturated group, more preferably an ethylenically unsaturated group corresponding to —$CR^1$═$CR^2R^3$ in formula (I). The ethylenically unsaturated group is preferably vinyl ($R^1$: hydrogen atom; $R^2$: hydrogen atom; $R^3$ hydrogen atom) or isopropenyl ($R^1$: methyl; $R^2$: hydrogen atom; $R^3$ hydrogen atom). Vinyl is preferably bound to methylene (vinyl+methylene=allyl) or carbonyl (vinyl+carbonyl=acryloyl), and isopropenyl is preferably bound to carbonyl (isopropenyl+carbonyl=methacryloyl). Acryloyl or methacryloyl is more preferred, and methacryloyl is still more preferred.

The ethylenically unsaturated group is contained in the polymer in an amount of preferably from 0.1 to 10.0 mmol, more preferably from 1.0 to 7.0 mmol, still more preferably from 2.0 to 5.0 mmol, per g of the polymer. The amount of ethylenically unsaturated group in the polymer can easily be measured by iodometric titration.

The binder polymer having an addition polymerizable group in its side chain is described in JP-A-2000-352824, JP-A-2001-109139, JP-A-2001-125265, JP-A-2001-117229, JP-A-2001-125257, JP-A-2001-228608, JP-A-2002-62648, JP-A-2002-156757, JP-A-2002-251008, JP-A-2002-229207 and JP-A-2002-162741.

The polymer has a weight-average molecular weight of preferably from 500 to 1,000,000, more preferably from 1,000 to 500,000, still more preferably from 2,000 to 300,000, most preferably from 5,000 to 200,000.

The binder polymer is contained in the image-forming layer in a content of preferably from 5 to 80% by weight, more preferably from 10 to 70% by weight, still more preferably from 15 to 60% by weight, particularly preferably from 20 to 50% by weight.

The main chain of hydrophobic polymer can have a substituent. Examples of the substituent include a halogen atom (F, Cl, Br, I), a hydroxyl group, a mercapto group, a cyano group, an aliphatic group, an aromatic group, a heterocyclic group, —O—R, —S—R, —CO—R, —NH—R, —N(—R)$_2$, —$N^+$ (—R)$_3$, —CO—O—R, —O—CO—R, —CO—NH—R, —NH—CO—R and —P(═O) (—O—R)$_2$. R represents an aliphatic group, an aromatic group or a heterocyclic group.

A plurality of the substituents of the main chain may be connected to each other to form an aliphatic ring or a hetero ring. The ring formed may be in a relation of spiro bond with respect to the main chain. The formed ring may have a substituent. Examples of the substituent include oxo (═O) in addition to the above-described substituents for the main chain.

Hydrophilic group of the hydrophilic polymer is preferably hydroxyl or polyether, more preferably hydroxyl. As the hydroxyl, hydroxyl of an alcohol is better than hydroxyl of phenol. The hydrophilic polymer may have other hydrophilic group (cationic group or anionic group) in addition to the nonionic group.

As the hydrophilic polymer, various natural polymers, semi-synthetic polymers or synthetic polymers may be used.

Examples of the natural or semi-synthetic polymers used include polysaccharides (e.g., gum arabic, starch derivatives, carboxymethyl cellulose, sodium salt thereof, cellulose acetate, and sodium alginate) and proteins (e.g., casein and gelatin).

Examples of the synthetic polymer having hydroxyl as the hydrophilic group include polyhydroxyethyl methacrylate, polyhydroxyethyl acrylate, polyhydroxypropyl methacrylate, polyhydroxypropyl acrylate, polyhydroxybutyl methacrylate, polyhydroxybutyl acrylate, polyallyl alcohol, polyvinyl alcohol and poly-N-methylolacrylamide.

Examples of the synthetic polymer having other hydrophilic group (e.g., amino, ether bond, hydrophilic heterocyclic group, amido bond, sulfo or ester bond) include polyethylene glycol, polypropylene glycol, polyvinyl formal, polyvinyl butyral, polyvinylpyrrolidone, polyacrylamide, polymethacrylamide, poly-N-isopropylacrylamide, poly-N,N-dimethylacrylamide, poly-N-acryloylmorpholine, poly-N-vinylpyrrolidone, poly-2-ethyl-2-oxazoline, poly-2-acrylamido-2-methylpropanesulfonic acid and the salt thereof, polyvinyl acetate, polyacrylamide and polyvinyl methyl ether.

Copolymers having two or more repeating units of the hydrophilic synthetic polymers may also be used. Copolymers having a repeating unit of the hydrophilic synthetic polymer and a repeating unit of the hydrophobic synthetic polymer (e.g., polyvinyl acetate or polystyrene) may also be used. Examples of the copolymer include a vinyl alcohol/vinyl acetate copolymer (partially saponified polymer of polyvinyl acetate). When a vinyl alcohol/vinyl acetate copolymer is synthesized by partial saponification of polyvinyl acetate, the saponification degree is preferably 60% or more, more preferably 80% or more.

Two or more polymer binders may be used in combination.

[Other Optional Components in the Image-forming Layer]

A colorant may be added to the image-forming layer for the purpose of easily distinguishing the image area from the non-image area after the image formation. As the colorant, a dye or a pigment having a large absorption in the visible light region is used. Examples of the colorant include Oil Yellow #101, Oil yellow #103, Oil pink #312, Oil Green BG, Oil Blue BOS, oil Blue #603, Oil Black BY, and Oil Black T-505 (manufactured by Orient Chemical Industries, Ltd.), Victoria Pure Blue, Crystal Violet (CI42555), Methyl Violet (CI42535). Ethyl Violet, Rhodamine B (CI45170B), Malachite Green (CI42000) and Methylene Blue (CI52015) As to dye to be used as the colorant, descriptions are given in JP-A-62-293247. Inorganic pigment such as titanium oxide can also be used as the colorant.

The addition amount of colorant is preferably from 0.01 to 10% by weight based on the image-forming layer.

To the image-forming layer may be added nonionic surfactants (described in JP-A-62-251740 and JP-A-3-208514), anionic surfactants, cationic surfactants (described in JP-A-2-195356), amphoteric surfactants (described in JP-A-59-121044 and JP-A-4-13149) or fluorine-containing surfactants. Of these, nonionic surfactants and anionic surfactants are preferred. Use of the anionic surfactant is particularly preferred for the on-machine development.

The surfactant is contained in the image-forming layer in an amount of from 0.05 to 15% by weight, more preferably from 0.1 to 5% by weight.

To the image-forming layer of the invention, a plasticizer may be added for imparting softness to the image-forming layer. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

The addition amount of the plasticizer to the image-forming layer is preferably from 0.1 to 50% by weight, more preferably from 1 to 30% by weight.

As a method for incorporating the constituting components in the image-forming layer employed in the invention, there can be employed several embodiments. One embodiment is a method of forming a molecular dispersion type (uniform) image-forming layer by dissolving the constituting components in an appropriate solvent and coating the solution as described in JP-A-2002-287334. Another embodiment is a method of forming a microcapsule type image-forming layer by encapsulating all or part of the constituting components in microcapsules as described in JP-A-2001-277740 and JP-A-2001-277742. Further, in the microcapsule type image-forming layer, the constituting components can be included outside the microcapsules. The microcapsule type image-forming layer preferably contains hydrophobic components within the microcapsules and hydrophilic components outside the microcapsules.

As a method for encapsulating the constituting components, known methods can be applied. Examples of a method for preparing microcapsules include a method of utilizing coacervation described in U.S. Pat. Nos. 2,800,457 and 2,800,458; a method by interfacial polymerization described in U.S. Pat. No. 3,287,154, JP-B-38-19574 and JP-B-42-446; a method by the deposition of a polymer described in U.S. Pat. Nos. 3,418,250 and 3,660,304; a method of using an isocyanate wall material described in U.S. Pat. No. 3,796,669; a method of using an isocyanate wall material described in U.S. Pat. No. 3,914,511; a method of using a urea-formaldehyde-base or urea-formaldehyde-resorcinol-base wall material described in U.S. Pat. Nos. 4,001,140, 4,087,376 and 4,089,802; a method of using a wall-forming material such as a melamine-formaldehyde resin or hydroxycellulose described in U.S. Pat. No. 4,025,445; an in situ method by polymerization of a monomer described in JP-B-36-9163 and JP-B-51-9079; a spray drying method described in British Patent 930,422 and U.S. Pat. No. 3,111,407; and an electrolytic dispersion cooling method described in British Patents 952,807 and 967,074. However, the production method of the microcapsules is not limited to these methods.

The preferred microcapsule wall used in the invention has a three-dimensional cross-linkage and has a property of being swollen with a solvent. From this viewpoint, polyurea, polyurethane, polyester, polycarbonate, polyamide and a mixture thereof are preferred as the wall material for microcapsules. Particularly, polyurea and polyurethane are preferred. Also, a compound having a cross-linkable functional group capable of being introduced into the above-described binder polymer, such as an ethylenically unsaturated bond, may be introduced into the microcapsule wall.

The microcapsules have an average particle size of preferably from 0.01 to 3.0 μm, more preferably from 0.05 to 2.0 μm, particularly preferably from 0.10 to 1.0 μm. Good resolution and good preservation stability can be obtained by microcapsules having an average particle size within the range.

The image-forming layer can be formed by dissolving, dispersing or emulsifying the components including the microcapsules in a proper liquid medium to prepare a coating solution, coating the solution on a hydrophilic support described hereinafter, and drying to remove the liquid medium. Examples of the liquid medium used for the coating solution include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. Two or more liquid media may be used in combination.

The concentration of the total solid components is preferably from 0.1 to 50% by weight.

The dry coated amount of the image-forming layer is preferably from 0.5 to 5.0 $g/m^2$.

Also, in the invention, it is preferred to further add a small amount of thermal polymerization inhibitor for preventing undesired thermal polymerization of the compound having a polymerizable ethylenically unsaturated double bond during preparation or storage of the image-forming composition, in addition to the above-described fundamental components. Examples of the suitable thermal polymerization inhibitor suitably used include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxyamine cerium (III) salt. The addition amount of the thermal polymerization inhibitor is preferably from about 0.01% by weight to about 5% by weight based on the weight of the whole composition. If desired, in the case of adding to the image-forming composition a higher fatty acid derivative such as behenic acid or behenic acid amide for preventing polymerization inhibition due to oxygen to prepare a lithographic printing plate precursor, the derivative may be allowed to exist only on the surface of the image-forming layer during the drying step after coating the image-forming composition on the support. The addition amount of the higher fatty acid derivative is preferably from about 0.5% by weight to about 10% by weight based on the weight of the whole composition.

[Hydrophilic Support]

As the hydrophilic support, a metal plate, plastic film or paper may be used. Specifically, a surface-treated aluminum plate, a plastic film subjected to a hydrophilicity-imparting treatment, or a water-resistant paper is preferred. More specifically, an anodized aluminum plate, a polyethylene terephthalate film having a hydrophilic layer or a polyethylene-laminated paper is preferred.

An anodized aluminum plate is particularly preferred.

The aluminum plate is a pure aluminum plate or an aluminum alloy plate containing aluminum as a major component and a very small amount of foreign element(s). Examples of the foreign element contained in the aluminum alloy include silicon, iron, manganese, copper, magnesium, chromium, zinc, bismuth, nickel and titanium. The content of the foreign element in the aluminum alloy is preferably 10% by weight or less. The aluminum plate may be a commercially available aluminum plate for printing use.

The thickness of the aluminum plate is preferably from 0.05 to 0.6 mm, preferably from 0.1 to 0.4 mm, particularly preferably 0.15 to 0.3 mm.

The surface of the aluminum plate is preferably subjected to a graining treatment. The graining treatment can be conducted by a mechanical method, an electrochemical method or a chemical method. As the mechanical method, a ball graining method, a brush graining method, a blast graining method or a buff graining method can be employed. As the electrochemical method, a method of conducting electrolysis in an electrolytic solution containing an acid such as hydrochloric acid or nitric acid using an alternating current or a direct current can be used. An electrolytically graining method using a mixed acid (described in JP-A-54-63902) can also be used. As the chemical method, a method of dipping an aluminum plate in a saturated aqueous solution of aluminum salt of mineral acid (described in JP-A-54-31187) is suitable.

It is preferred that the graining treatment is conducted to an extent that the centerline average roughness (Ra) of the surface of aluminum plate becomes in the range of from 0.2 to 1.0 μm.

The surface-grained aluminum plate is, if desired, subjected to an alkali etching treatment. As the alkali etching treatment solution, an aqueous solution of potassium hydroxide or sodium hydroxide is commonly used. After the alkali etching treatment, the plate is preferably subjected to a neutralizing treatment.

The anodizing treatment of aluminum plate is conducted for enhancing abrasion resistance of the support.

As the electrolyte used in the anodizing treatment, various electrolytes forming a porous oxide film can be used. Ordinarily, sulfuric acid, hydrochloric acid, oxalic acid, chromic acid or a mixture thereof is used as the electrolyte.

Conditions of the anodizing treatment are ordinarily as follows. The concentration of electrolyte is from 1 to 80% by weight, the solution temperature is from 5 to 70° C., a current density is from 5 to 60 $A/dm^2$, an electric voltage is from 1 to 100 V, and the electrolytic time is in the range of from 10 seconds to 5 minutes.

An amount of the oxide film formed by the anodizing treatment is preferably from 1.0 to 5.0 $g/m^2$, more preferably from 1.5 to 4.0 $g/m^2$.

The oxide film formed by the anodizing treatment may further be subjected to silicate treatment to form a hydrophilic surface. Treatment of using an aqueous solution of an alkali metal silicate (e.g., sodium silicate) is described in U.S. Pat. Nos. 2,714,066, 3,181,461, 3,280,734 and 3,902,734.

The concentration of alkali metal silicate in the aqueous solution is preferably from 0.1 to 30% by weight, more preferably from 0.5 to 15% by weight. The pH of the aqueous solution at 25° C. is preferably from 10 to 13.5. The temperature of the aqueous solution is preferably from 5 to 80° C., more preferably from 10 to 70° C., still more preferably from 15 to 50° C. The treating time is preferably from 0.5 to 120 seconds. As to a method of contacting the anodized film with the aqueous solution, a dipping method or a spraying method is preferred.

The alkali metal used as a counter ion in the silicate is preferably sodium, potassium or lithium. The pH of the aqueous solution of alkali metal silicate is preferably adjusted by using a hydroxide (e.g., sodium hydroxide, potassium hydroxide or lithium hydroxide). An alkaline earth metal salt or a group-IVb metal salt may also be incorporated in the aqueous solution. The alkaline earth metal salt is preferably water-soluble. Examples of the alkaline earth metal salt include nitrates (e.g., calcium nitrate, strontium nitrate, magnesium nitrate and barium nitrate), sulfates, hydrochlorides, phosphates, acetates, oxalates and borates. Examples of the group-IVb metal salt include titanium tetrachloride, titanium trichloride, potassium titanium fluoride, potassium titanium oxalate, titanium sulfate, titanium tetraiodide and zirconium oxide chloride. Two or more of the alkaline earth metal salts or group-IVb metal salts may be used in combination. The addition amount of the alkaline earth metal salt or group-IVb metal salt is preferably from 0.01 to 10% by weight, more preferably from 6.05 to 5.0% by weight.

[Interlayer]

The lithographic printing plate precursor of the invention may have an interlayer between the hydrophilic support and the image-forming layer for the purpose of enhancing adhesion between the hydrophilic support and the image-forming layer.

The interlayer is not particularly limited, but examples of this interlayer include those described in JP-A-2001-175001, JP-A-2002-312068 and JP-A-2002-323770.

[Water-soluble Overcoat Layer]

A water-soluble overcoat layer can be provided on the image-forming layer for preventing the surface of image-forming layer from stain due to lipophilic substances.

The water-soluble overcoat layer is constituted by a material which can easily be removed upon printing. Thus, it is preferred to constitute the water-soluble overcoat layer by a water-soluble organic polymer. Examples of the water-soluble organic polymer include polyvinyl alcohol, polyvinyl acetate, polyacrylic acid, the alkali metal salt or amine salt thereof, polymethacrylic acid, an alkali metal salt or amine salt thereof, polyacrylamide, polyhydroxyethyl acrylate, polyvinylpyrrolidone, polyvinyl methyl ether, poly-2-acrylamido-2-methyl-1-propanesulfonic acid, an alkali metal salt or amine salt thereof, gum arabic, cellulose ether (e.g., carboxymethyl cellulose, carboxyethyl cellulose, methyl cellulose), dextrin and a derivative thereof (e.g., white dextrin, enzyme-decomposed etherified dextrin pullulan).

Copolymers having two or more kinds of repeating units of the water-soluble organic polymers may be used. Examples of the copolymer include vinyl alcohol/vinyl acetate copolymer (partially saponified polymer of polyvinyl acetate) and vinyl methyl ether/maleic anhydride copolymer. In the case of synthesizing vinyl alcohol/vinyl acetate copolymer by partial saponification of polyvinyl acetate, the saponification degree is preferably 65% by weight or more.

Two or more kinds of the water-soluble organic polymers may be used in combination.

The aforesaid infrared absorbing agent may be added to the overcoat layer. The infrared absorbing agent to be added to the overcoat layer is preferably water-soluble.

To the coating solution for overcoat layer may be added a nonionic surfactant (e.g., polyoxyethylene nonylphenyl ether or polyoxyethylene dodecyl ether).

Also, it is possible to add a colorant which shows an excellent transmission for exposure light (e.g., infrared laser of 700 to 1200 nm in wavelength) and effectively absorbs light of wavelength ineffective for the exposure (e.g., water-soluble dye) to enhance safe-light adaptability without causing reduction in sensitivity.

The overcoat layer (protective layer) is described in U.S. Pat. No. 3,458,311 and JP-A-55-49729.

The coated amount of the overcoat layer is preferably from 0.01 to 3.0 $g/m^2$, more preferably from 0.05 to 2.5 $g/m^2$, still more preferably from 0.1 to 2.0 $g/m^2$, still more preferably from 0.2 to 1.5 $g/m^2$, most preferably from 0.25 to 1.0 $g/m^2$.

[Imagewise Heating Step]

The lithographic printing plate precursor is subjected to scanning exposure with infrared laser based on digital data to form an image. The wavelength of infrared laser is preferably from 700 to 1200 nm. The infrared ray is preferably from a solid high-output infrared laser (e.g., a semiconductor laser or YAG laser).

When the image-forming layer containing the infrared absorbing agent is subjected to the scanning exposure with a laser light, the light energy of laser light is converted to heat energy. Thus, in the heated areas (image areas) of the lithographic printing plate precursor, a heat-reactive compound reacts to form a hydrophobic region.

[Plate-making Step and Printing Step]

Plate making and printing can be continuously conducted by merely immediately mounting the imagewise heated lithographic printing plate precursor on a printing machine, and conducting printing through ordinary procedures using an ink and a fountain solution. Specifically, when the printing machine is started with the lithographic printing plate precursor mounted on the machine, the image-forming layer in non-heated areas (non-image areas) can be removed with the fountain solution or the ink or by rubbing.

Use of a printing machine having a laser light-exposing device (described in Japanese Patent No. 2,938,398) permits to mount the lithographic printing plate precursor on the printing machine cylinder, expose by means of the laser mounted on the printing machine, and apply a fountain solution or an ink to thereby conduct on-machine development (procedures from exposure to printing being continuously conducted).

Also, it is possible to further heat the whole surface of the thus-formed printing plate to react the unreacted thermally reactive compound remaining in the image areas, thereby improving strength (printing durability) of the printing plate.

The invention is described in more detail by reference to examples below, but the invention should not be construed as being limited thereto.

EXAMPLE 1

(Preparation of Support)

A 0.3-mm thick aluminum plate in accordance with JIS-A-1050 was subjected to the following steps in sequence.

[Alkali Etching Treatment]

A 70° C. sodium hydroxide aqueous solution (concentration: 26% by weight; aluminum ion concentration: 6.5% by weight) was sprayed against an aluminum plate to dissolve the aluminum plate in an amount of 6 g/m$^2$. Thereafter, the aluminum plate was washed by spraying well water.

[Desmut Treatment]

The aluminum plate was subjected to desmut treatment by spraying a 30° C. aqueous solution of nitric acid (nitric acid concentration: 1% by weight; containing 0.5% by weight of aluminum ion), followed by washing with sprayed water. As the nitric acid aqueous solution used in the desmut treatment, a waste solution from the step of electrochemically graining of the aluminum plate in a nitric acid aqueous solution using an alternating current was used.

[Electrochemically Graining Treatment]

Electrochemically graining treatment was conducted continuously using a 60 Hz alternating current. The electrolytic solution used was an aqueous solution containing 10.5 g/liter of nitric acid (aluminum ion content: 5 g/liter) and having a temperature of 50° C. The electrochemical graining treatment was conducted using an alternating current of rectangular wave of trapezoidal pattern wherein the time of from 0 to peak in current value, TP, is 0.8 ms and duty ratio is 1:1 and using a carbon electrode as the counter electrode. Ferrite was used as an auxiliary anode. The electrolytic bath used was of a radial cell type. The electric current density was 30 A/dm2 in terms of the current peak value, and the quantity of electricity was 220 C/dm$^2$ in terms of total electricity quantity while the aluminum plate functioned as anode. 5% of the current supplied from the power source was passed through the auxiliary anode. Thereafter, the plate was washed with well water by spraying.

[Alkali Etching Treatment]

The aluminum plate was subjected to etching treatment by spraying an aqueous solution of sodium hydroxide (concentration: 26% by weight; concentration of aluminum ion: 6.5% by weight) at 32° C. to thereby dissolve the aluminum plate in an amount of 0.20 g/m$^2$. Thus, smut component mainly comprising aluminum hydroxide generated upon the electrochemical graining using an alternating current in the preceding step was removed, and edge portions of formed pits were dissolved to make the edge portion smooth. Thereafter, the aluminum plate was washed with well water by spraying. The etching amount was 3-5 g/m$^2$.

[Desmut Treatment]

Desmut treatment was conducted by spraying a 30° C. aqueous solution containing 15% by weight of nitric acid (containing 4.5% by weight of aluminum ion). Thereafter, the plate was washed with well water by spraying. As the nitric acid aqueous solution used in the desmut treatment, a waste solution from the step of electrochemical graining using an alternating current in a nitric acid aqueous solution was used.

[Anodizing Treatment]

Sulfuric acid was used as an electrolytic solution. The electrolytic solution contained sulfuric acid in a concentration of 170 g/liter (containing 0.5% by weight of aluminum ion) and had a temperature of 43° C. Thereafter, the plate was washed with well water by spraying. The electric current density was about 30 A/dm$^2$. The amount of final oxide film was 2.7 g/m$^2$.

[Treatment with Alkali Metal Silicate]

The alkali metal silicate treatment (silicate treatment) was conducted by dipping the thus-obtained aluminum plate for 10 seconds in a treating bath containing 30° C. aqueous solution containing 1% by weight of sodium silicate No.3. Thereafter, the plate was washed with well water by spraying to prepare an aluminum support. The amount of deposited silicate was 3.6 mg/m$^2$.

(Formation of Image-forming Layer)

A coating solution of the following formulation for image-forming layer was coated on the resulting support in a dry average thickness of 1.0 μm by a wire bar, and dried at 120° C. for 60 seconds to provide an image-forming layer.

| [Formulation of coating solution for image-forming layer (1)] | |
|---|---|
| Infrared ray-absorbing dye (D-1) shown below | 2 parts by weight |
| Initiator (I-1) shown below | 10 parts by weight |
| Dipentaerythritol hexaacrylate (NK Ester A-DPH; made by Shin Nakamura Kagaku Kogyo K.K.) | 55 parts by weight |
| Binder polymer (B-1) shown below | 37 parts by weight |
| Fluorine-containing surfactant (W-1) shown below | 6 parts by weight |
| Mizukasil P-78A (fine powder silica; average particle size: 3.3 μm; made by Mizusawa Industrial Chemicals, Ltd. | 5 parts by weight |
| Methyl ethyl ketone | 900 parts by weight |

D-1

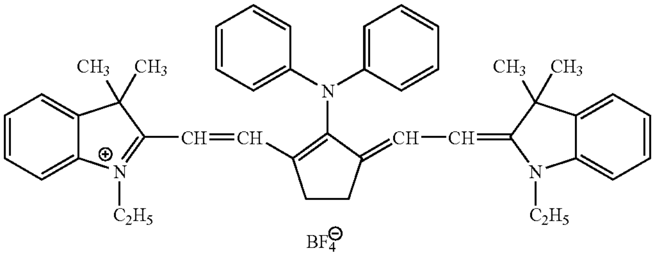

I-1

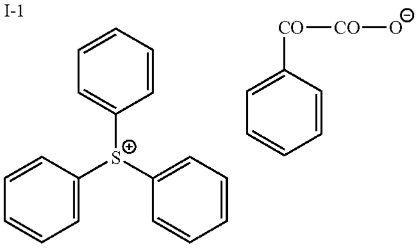

B-1

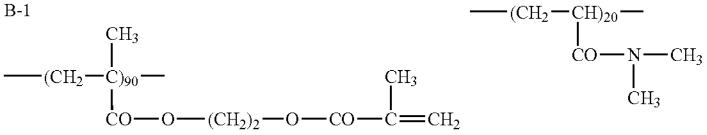

Weight average molecular weight: 65,000

W-1

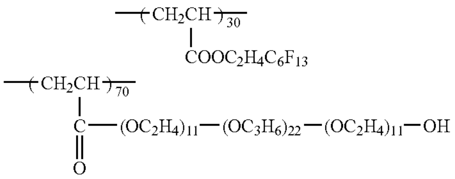

(Evaluation of Lithographic Printing Plate Precursor)

The thus-obtained lithographic printing plate precursor was imagewise exposed with a test pattern by means of an image setter (Trendsetter 3244VX; made by Creo Inc.) with a beam intensity of 10.2 W and a drum rotation speed of 150 rpm. Subsequently, without development processing, the precursor was mounted on a cylinder of a printing machine (SPRINTS26; made by K.K. Komori Corporation), and a 4%-diluted solution of a commercially available stock fountain solution (IF-102; made by Fuji Photo Film Co., Ltd.) was supplied as a fountain solution, then a black ink (Values-G(sumi); made by Dai-Nippon Ink Chemicals, Inc.) was supplied and, further, paper was supplied to conduct printing. The number of paper sheets required before obtaining good prints (on-machine developability) and the number of paper sheets which can be printed without the occurrence of stain or thin spot (printing durability) were counted to evaluate. Results are shown in Table 1.

COMPARATIVE EXAMPLE 1

A lithographic printing plate precursor was prepared in the same manner as in Example 1 except for omitting Mizukasil P-78A as a filler to evaluate. Results are shown in Table 1.

TABLE 1

| Lithographic printing Plate Precursor | On-Machine Developability (sheets) | Printing Durability (Sheets) |
|---|---|---|
| Example 1 | 90 | 4,000 |
| Comparative Example 1 | 400 | 4,000 |

EXAMPLE 2

On the image-forming layer formed in Example 1 was coated a coating solution of the following formulation for water-soluble overcoat layer (1) in a dry coating amount of 0.5 g/$m^2$, and dried at 125° C. for 75 seconds. The thus-prepared lithographic printing plate precursor was imagewise exposed and evaluated in the same manner as in Example 1. Results are shown in Table 2.

| [Formulation of water-soluble overcoat layer (1)] | |
|---|---|
| Polyvinyl alcohol (saponification degree: 98 mol %; polymerization degree: 500) | 95 parts by weight |
| Polyvinylpyrrolidone/vinyl acetate copolymer (Luvitec VA 64 W; made by BASF) | 4 parts by weight |
| Nonionic surfactant (EMALEX710; made by Nihon Emulsion K. K.) | 1 part by weight |
| Pure water | 3000 parts by weight |

COMPARATIVE EXAMPLE 2

A lithographic printing plate precursor was prepared in the same manner as in Example 2 except for omitting Mizukasil P-78A as a filler to evaluate. Results are shown in Table 2.

TABLE 2

| Lithographic printing Plate Precursor | On-Machine Developability (sheets) | Printing Durability (Sheets) |
|---|---|---|
| Example 2 | 100 | 9,000 |
| Comparative Example 2 | 600 | 10,000 |

EXAMPLE 3

An image-forming layer was provided by coating a coating solution of the following formulation for image-forming layer (2) in place of the coating solution for image-forming layer (1) used in Example -1 in a dry average film thickness of 0.7 μm by means of a wire bar and drying at 100° C. for 60 seconds. The thus-prepared lithographic printing plate precursor was imagewise exposed and evaluated in the same manner as in Example 1. Results are shown in Table 3.

| [Formulation of coating solution for image-forming layer (2)] | |
|---|---|
| Infrared ray-absorbing dye (D-2) shown below | 7 parts by weight |
| Initiator (I-2) shown below | 15 parts by weight |
| Polymerizable compound (M-1) shown below | 55 parts by weight |
| Polyvinylacetal resin (Elex BBM-S; made by Sekisui Kagaka Kogyo K.K. | 27 parts by weight |
| Sodium dodecylbenzenesulfonate (Neopelex G-25; made by Kao K.K.) | 6 parts by weight |
| MP-4540M (silica sol; average particle size: 0.45 μm; made by Nissan Kagaku Kogyo K.K.) | 15 parts by weight |
| Methyl ethyl ketone | 900 parts by weight |

Infrared ray-absorbing dye (D-2)

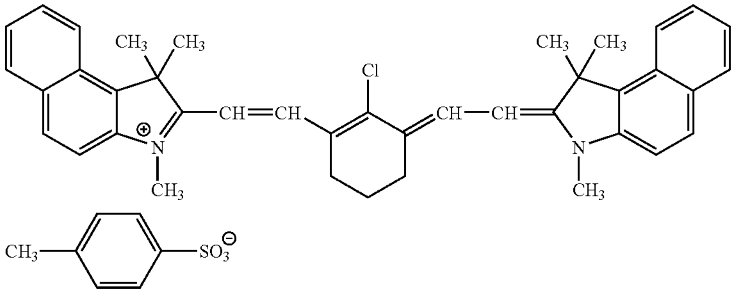

-continued

[Formulation of coating solution for image-forming layer (2)]

Initiator (I-2)

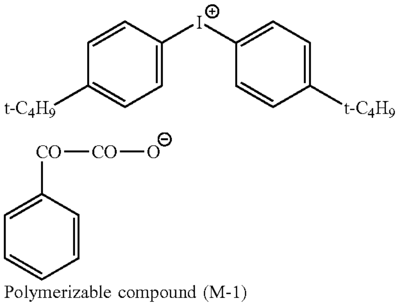

Polymerizable compound (M-1)

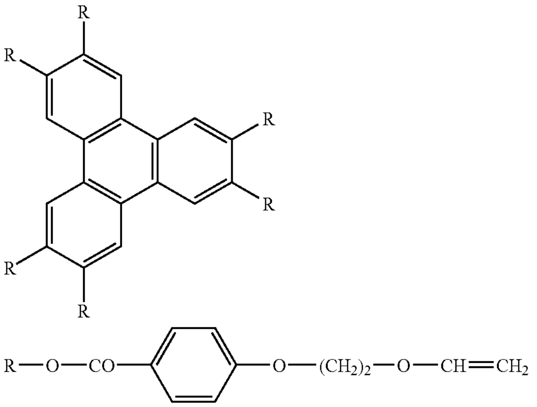

COMPARATIVE EXAMPLE 3

A lithographic printing plate precursor was prepared in the same manner as in Example 3 except for omitting MP-4540M as a filler to evaluate. Results are shown in Table 3.

TABLE 3

| Lithographic printing Plate Precursor | On-Machine Developability (sheets) | Printing Durability (Sheets) |
|---|---|---|
| Example 3 | 50 | 3,000 |
| Comparative Example 3 | 250 | 3,000 |

EXAMPLE 4

An image-forming layer was provided by coating a coating solution of the following formulation for image-forming layer (3) in place of the coating solution for image-forming layer (1) used in Example 1 in a dry average film thickness of 1.2 μm by means of a wire bar and drying at 100° C. for 60 seconds. The thus-prepared lithographic printing plate precursor was imagewise exposed and evaluated in the same manner as in Example 1. Results are shown in Table 4.

| [Formulation of coating solution for image-forming layer (3)] | |
|---|---|
| Infrared ray-absorbing dye (D-1) used in Example 1 | 2 parts by weight |
| Initiator (I-1) used in Example 1 | 10 parts by weight |
| Polymerizable compound (M-2) shown below | 46 parts by weight |
| Binder polymer (B-2) shown below | 46 parts by weight |
| Fluorine-containing surfactant (W-1) used in Example 1 | 6 parts by weight |
| Molecular sieve 4A (Zeolite, particle size; <5 μm; made by | 3 parts by weight |

-continued

| [Formulation of coating solution for image-forming layer (3)] | |
|---|---|
| Aldrich Co.) | |
| Methyl ethyl ketone | 900 parts by weight |

M-2

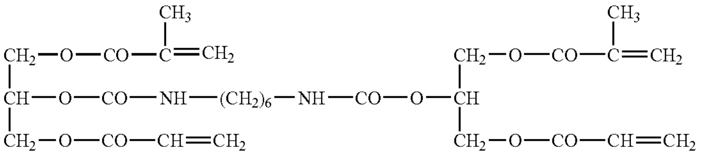

B-2

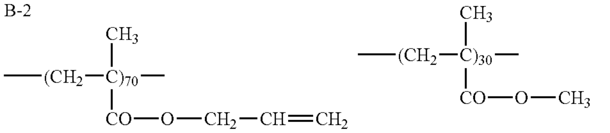

Weight average molecular weight: 110,000

COMPARATIVE EXAMPLE 4

A lithographic printing plate precursor was prepared in the same manner as in Example 4 except for omitting Molecular sieve 4A as a filler to evaluate. Results are shown in Table 4.

TABLE 4

| Lithographic printing Plate Precursor | On-Machine Developability (sheets) | Printing Durability (Sheets) |
|---|---|---|
| Example 4 | 60 | 4,000 |
| Comparative Example 4 | 240 | 3,500 |

EXAMPLE 5

An image-forming layer was provided by coating a coating solution of the following formulation for image-forming layer (4) in place of the coating solution for image-forming layer (1) used in Example 1 in a dry average film thickness of 0.7 μm by means of a wire bar and drying at 100° C. for 60 seconds. The thus-prepared lithographic printing plate precursor was imagewise exposed and evaluated in the same manner as in Example 1. Results are shown in Table 5.

| [Formulation of coating solution for image-forming layer (4)] | |
|---|---|
| Infrared ray-absorbing dye (D-1) used in Example 1 | 5 parts by weight |
| Initiator (I-1) used in Example 1 | 10 parts by weight |
| Polymerizable compound (M-3) shown below | 50 parts by weight |
| Binder polymer (B-3) shown below | 42 parts by weight |
| Fluorine-containing surfactant (W-1) used in Example 1 | 3 parts by weight |
| Nanotitania NTB (brookite type titanium oxide particles; average particle size: 0.02 μm; made by Showa Denko K.K.) | 8 parts by weight |
| Methyl ethyl ketone | 900 parts by weight |

Polymerizable compound (M-3)

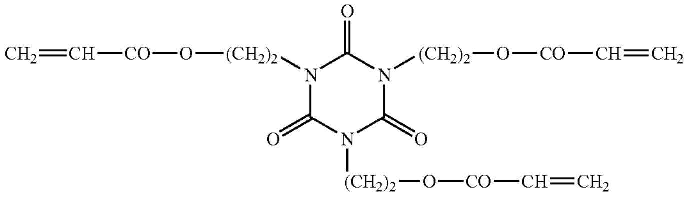

-continued

| [Formulation of coating solution for image-forming layer (4)] |
|---|

Binder polymer (B-3)

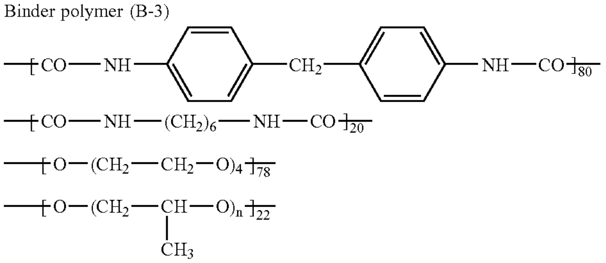

n (average): 17.2
Weight average molecular weight: 65,000

A lithographic printing plate precursor was prepared in the same manner as in Example 5 except for omitting Nanotitania NTB as a filler to evaluate.

Results are shown in Table 5.

TABLE 5

| Lithographic printing Plate Precursor | On-Machine Developability (sheets) | Printing Durability (Sheets) |
|---|---|---|
| Example 5 | 120 | 4,000 |
| Comparative Example 5 | 400 | 4,000 |

EXAMPLE 6

(Preparation of Microcapsule Dispersion)

6 Parts by weight of an adduct between trimethylolpropane and xylylenediisocyanate (1:3 in molar ratio) (Takenate D-110N; made by Mitsui Takeda Chemical K.K.; containing 25% by weight of ethyl acetate), 7.5 parts by weight of dipentaerythritol hexaacrylate (NK Ester A-DPH; made by Sin Nakamura Kagaku Kogyo K.K.), 1.5 parts by weight of an infrared ray-absorbing dye (D-3) shown below, and 0.1 part by weight of an anionic surfactant (Pionine P-A41C; made by Takemoto Oil & Fat Co., Ltd.) were dissolved in 17.7 parts by weight of ethyl acetate to prepare an oil phase.

Separately, 37.5 parts by weight of a 4% by weight aqueous solution of polyvinyl alcohol (PVA205; made by Kuraray) was prepared as an aqueous phase. The oil phase and the aqueous phase were mixed with each other, and emulsified in a homogenizer for 10 minutes at 12,000 rpm under water-cooling. 24.5 parts by weight of water was added to the emulsion, followed by stirring at room temperature for 30 minutes, then at 40° C. for 3 hours to prepare a microcapsule dispersion. The dispersion has a solid content of 20.0% by weight, and the average particle size of the microcapsules was 0.36 μm.

(D-3)

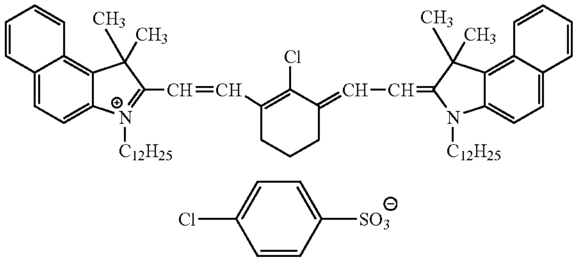

Infrared ray-absorbing dye (Preparation of Lithographic Printing Plate Precursor)

105 Parts by weight of water, 45 parts by weight of the thus-prepared microcapsule dispersion, 1 part by weight of Initiator (I-1) used in Example 1, a fluorine-containing surfactant (Megafac F-171; made by Dainippon Ink & Chemicals, Inc.) and 0.7 part by weight of Mizukasil P802 (fine powder silica; average particle size: 2.4 μm; made by Mizusawa Industrial Chemicals, Ltd.) were mixed to prepare a coating solution for image-forming layer (5). The coating solution for image-forming layer (5) was coated on the aluminum support used in Example 1 in a dry average thickness of 1.0 μm by means of a wire bar, then dried at 70° C. for 90 seconds in an oven to provide the image-forming layer (5). Thus, a lithographic printing plate precursor was prepared.

(Plate Making, Printing and Evaluation)

The thus-prepared lithographic printing plate precursor was imagewise exposed and evaluated in the same manner as in Example 1. Results are shown in Table 6.

COMPARATIVE EXAMPLE 6

A lithographic printing plate precursor was prepared in the same manner as in Example 6 except for omitting Mizukasil P802 as a filler to evaluate. Results are shown in Table 6.

TABLE 6

| Lithographic printing Plate Precursor | On-Machine Developability (sheets) | Printing Durability (Sheets) |
|---|---|---|
| Example 6 | 30 | 2,000 |
| Comparative Example 6 | 150 | 2,000 |

EXAMPLE 7

(Preparation of Microcapsule Dispersion)

10 Parts by weight of an adduct between trimethylolpropane and xylylenediisocyanate (1:3 in molar ratio) (Takenate D-110N; made by Mitsui Takeda Chemical K.K.; containing 25% by weight of ethyl acetate), 3.15 parts by weight of pentaerythritol triacrylate (SR444; made by Nihon Kayaku K.K.), 0.35 parts by weight of an infrared ray-absorbing dye (D-4) shown below, 1 part by weight of 3-(N,N-diethylamino)-6-methyl-7-anilinofluoran (ODB; made by Yamamoto Kasei K.K.) and 0.1 part by weight of an anionic surfactant (Pionine P-A41C; made by Takemoto Oil & Fat Co., Ltd.) were dissolved in 17 parts by weight of ethyl acetate to prepare an oil phase.

Separately, 40 parts by weight of a 4% by weight aqueous solution of polyvinyl alcohol (PVA205; made by Kuraray) was prepared as an aqueous phase.

The oil phase and the aqueous phase were mixed with each other, and emulsified in a homogenizer for 10 minutes at 12,000 rpm under water-cooling. 25 Parts by weight of water was added to the emulsion, followed by stirring at room temperature for 30 minutes, then at 40° C. for 3 hours to prepare a microcapsule dispersion. The dispersion has a solid content of 19.8% by weight, and the average particle size of the microcapsules was 0.30 μm.

D-4

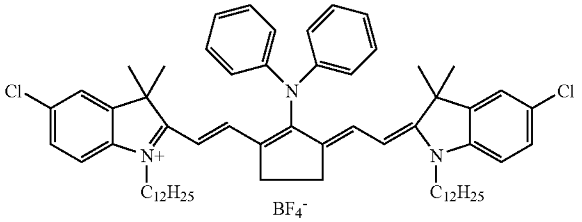

Infrared ray-absorbing dye (Preparation of Lithographic Printing Plate Precursor)

100 Parts by weight of water, 25 parts by weight of the thus-prepared microcapsule dispersion, 0.5 part by weight of Initiator (I-1) used in Example 1, 0.2 part by weight of Fluorine-containing surfactant (W-1) used in Example 1 and 0.5 part by weight of Tospearl 130 (silicone resin fine particles; average particle size: 3.0 μm; made by GE Toshiba Silicone K.K.) were mixed to prepare a coating solution for image-forming layer (6). The coating solution for image-forming layer (6) was coated on the aluminum support used in Example 1 in a dry average thickness of 1.2 μm by means of a wire bar, then dried at 70° C. for 60 seconds in an oven to provide the image-forming layer (6). Thus, a lithographic printing plate precursor was prepared.

(Plate Making, Printing and Evaluation)

The thus-prepared lithographic printing plate precursor was imagewise exposed and evaluated in the same manner as in Example 1. Results are shown in Table 7.

COMPARATIVE EXAMPLE 7

A lithographic printing plate precursor was prepared in the same manner as in Example 7 except for omitting Tospearl 130 as a filler to evaluate. Results are shown in Table 7.

TABLE 7

| Lithographic printing Plate Precursor | On-Machine Developability (sheets) | Printing Durability (Sheets) |
|---|---|---|
| Example 7 | 40 | 3,500 |
| Comparative Example 7 | 180 | 3,000 |

It is apparent from the results described above that the lithographic printing plate precursor of the invention is excellent in on-machine developability without damaging printing durability.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing method comprising the steps of:

imagewise exposing a lithographic printing plate precursor with infrared laser, making a lithographic printing plate by removing unexposed areas of the image-forming layer of the lithographic printing plate precursor mounted on a cylinder of a printing machine; and conducting printing using the lithographic printing plate mounted on the cylinder of the printing machine, wherein the lithographic printing plate precursor is capable of being on-machine developed by supplying at least one of an ink and a fountain solution and comprises a hydrophilic support having provided thereon an image-forming layer containing components (1) to (4):

(1) an infrared absorbing agent;

(2) a compound capable of generating a radical;

(3) a compound capable of undergoing addition polymerization with a radical; and (4) a filler having an average partiele size of from 0.03 to 200 μm.

2. The lithographic printing method as claimed in claim 1, wherein the filler is selected from the group consisting of metal oxides, metal silicates and internally crosslinked organic fine particles.

3. The lithographic printing method as claimed in claim 1, wherein the filler is selected from the group consisting of silica, alumina, titanium oxide, talc, kaolin, clay, activated clay, zeolite and glass bead.

4. The lithographic printing method as claimed in claim 1, wherein the filler has a shape selected from the group consisting of fibrous, granular, needle-like, platy and spherical shapes.

5. The lithographic printing method as claimed in claim 1, wherein the filler is surface-treated with a compound having an ethylenically unsaturated bond.

6. The lithographic printing method as claimed in claim 1, wherein the filler is subjected to a hydrophilicity-imparting treatment.

7. The lithographic printing method as claimed in claim 1, wherein the filler is surface treated with at least one treating agent selected from the group consisting of a silane coupling agent, a titanate coupling agent, an aluminate coupling agent, a polyethylene glycol-type non-ionic surfactant, a polyhydric alcohol-type non-ionic surfactant and a phosphoric acid coupling agent.

8. The lithographic printing method as claimed in claim 1, wherein an amount of the filler in the image-forming layer is from 0.1 to 30% by weight.

9. A lithographic printing method comprising the steps of:

imagewise exposing a lithographic printing plate precursor with infrared laser, making a lithographic printing plate by removing unexposed areas of the image-forming layer of the lithographic printing plate precursor mounted on a cylinder of a printing machine; and conducting printing using the lithographic printing plate mounted on the cylinder of the printing machine;

wherein the lithographic printing plate precursor is capable of being one-machine developed by supplying at least one of an ink and a fountain solution and comprises a hydrophilic support having provided thereon an image-forming layer containing components (1) to (4):

(1) an infrared absorbing agent;

(2) a compound capable of generating an acid;

(3) a compound capable of undergoing addition polymerization with an acid; and (4) a filler having an average particle of from 0.03 to 200 μm.

10. The lithographic printing method as claimed in claim 9, wherein the filler is selected from the group consisting of metal oxides, metal silicates and internally crosslinked organic fine particles.

11. The lithographic printing method as claimed in claim 9, wherein the filler is selected from the group consisting of silica, alumina, titanium oxide, talc, kaolin, clay, activated clay, zeolite and glass bead.

12. The lithographic printing method as claimed in claim 9, wherein the filler has a shape selected from the group consisting of fibrous, granular, needle-like, platy and spherical shapes.

13. The lithographic printing method as claimed in claim 9, wherein the filler is surface-treated with a compound having an ethylenically unsaturated bond.

14. The lithographic printing method as claimed in claim 9, wherein the filler is subjected to a hydrophilicity-imparting treatment.

15. The lithographic printing method as claimed in claim 9, wherein the filler is surface treated with at least one treating agent selected from the group consisting of a silane coupling agent, a titanate coupling agent, an aluminate coupling agent, a polyethylene glycol-type non-ionic surfactant, a polyhydric alcohol-type nonionic surfactant and a phosphoric acid coupling agent.

16. The lithographic printing method as claimed in claim 9, wherein an amount of the filler in the image-forming layer is from 0.1 to 30% by weight.

17. The lithographic printing method as claimed in claim 1, wherein the filler is internally crosslinked organic fine particles.

18. The lithographic printing method as claimed in claim 9, wherein the filler is internally crosslinked organic fine particles.

* * * * *